United States Patent
Suzuki et al.

(10) Patent No.: US 9,045,613 B2
(45) Date of Patent: Jun. 2, 2015

(54) POLYMER COMPOSITION AND POLYMER LIGHT-EMITTING DEVICE USING SAME

(75) Inventors: Tomoyuki Suzuki, Tokyo (JP);
Kiyotoshi Iimura, Ibaraki (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 745 days.

(21) Appl. No.: 11/920,547

(22) PCT Filed: May 18, 2006

(86) PCT No.: PCT/JP2006/309935
§ 371 (c)(1),
(2), (4) Date: Nov. 16, 2007

(87) PCT Pub. No.: WO2006/123741
PCT Pub. Date: Nov. 23, 2006

(65) Prior Publication Data
US 2009/0103284 A1    Apr. 23, 2009

(30) Foreign Application Priority Data

May 20, 2005 (JP) .................................. 2005-148204
May 20, 2005 (JP) .................................. 2005-148205

(51) Int. Cl.
*G02F 1/13357* (2006.01)
*B32B 3/00* (2006.01)
(Continued)

(52) U.S. Cl.
CPC ....... *C08K 5/0008* (2013.01); *Y10T 428/24479* (2015.01); *C09K 11/06* (2013.01); *C09K 2211/1029* (2013.01); *C09K 2211/1033* (2013.01); *C09K 2211/1037* (2013.01); *C09K 2211/1092* (2013.01);
(Continued)

(58) Field of Classification Search
USPC .......................................................... 428/690
See application file for complete search history.

(56) References Cited

U.S. PATENT DOCUMENTS 6,916,902 B2 * 7/2005 Inbasekaran et al. .......... 528/397
7,033,680 B2 * 4/2006 Tanaka et al. .................. 428/690
(Continued)

FOREIGN PATENT DOCUMENTS

CN    1347268 A    5/2002
EP    1 229 063 A   8/2002
(Continued)

OTHER PUBLICATIONS

Decision of Rejection, drafted Mar. 19, 2012, received from the Japanese Patent Office in corresponding Japanese Patent Application No. 2006-139774, along with an English translation thereof.
(Continued)

*Primary Examiner* — J. L. Yang
(74) *Attorney, Agent, or Firm* — Sughrue Mion, PLLC

(57) ABSTRACT

Disclosed is a composition containing one or more aromatic ether compounds, one or more compounds having a boiling point of not less than 200° C., and one or more polymers which are charge-transporting or luminescent in a solid state. This composition is characterized in that the compounds having a boiling point of not less than 200° C. are selected from the group consisting of aliphatic compounds which may have a heteroatom, alicyclic compounds which may have a heteroatom, aromatic compounds having two or less substituents and a heterocyclic compounds having two or less substituents.

16 Claims, 1 Drawing Sheet

(51) Int. Cl.
*C08L 81/02* (2006.01)
*H01L 21/47* (2006.01)
*H01L 51/50* (2006.01)
*C08K 5/00* (2006.01)
*C09K 11/06* (2006.01)
*H05B 33/14* (2006.01)
*H01L 51/00* (2006.01)

(52) U.S. Cl.
CPC .......... *C09K 2211/1416* (2013.01); *C09K 2211/1425* (2013.01); *C09K 2211/1433* (2013.01); *C09K 2211/1458* (2013.01); *C09K 2211/1466* (2013.01); *C09K 2211/1475* (2013.01); *C09K 2211/185* (2013.01); *H01L 51/0007* (2013.01); *H01L 51/0036* (2013.01); *H01L 51/0043* (2013.01); *H01L 51/0085* (2013.01); *H01L 51/5012* (2013.01); *H05B 33/14* (2013.01)

(56) References Cited

U.S. PATENT DOCUMENTS

| | | |
|---|---|---|
| 2004/0127666 A1 | 7/2004 | Inbasekaran et al. |
| 2004/0170861 A1 | 9/2004 | Culligan et al. |
| 2004/0225056 A1 | 11/2004 | Spreitzer et al. |
| 2005/0004303 A1 | 1/2005 | Miyakawa et al. |
| 2005/0005285 A1 | 1/2005 | Olson et al. |
| 2005/0107526 A1 | 5/2005 | Katou et al. |
| 2006/0045959 A1 | 3/2006 | Yasukawa et al. |
| 2006/0046062 A1 | 3/2006 | Nishigaki et al. |
| 2009/0033208 A1 | 2/2009 | Nagayama et al. |

FOREIGN PATENT DOCUMENTS

| | | |
|---|---|---|
| EP | 1850368 A1 | 1/2007 |
| JP | 2000-036390 A | 2/2000 |
| JP | 2000-086906 A | 3/2000 |
| JP | 2002-038007 A | 2/2002 |
| JP | 2003-229256 A | 8/2003 |
| JP | 2003-308969 A | 10/2003 |
| JP | 2004-002703 A | 1/2004 |
| JP | 2004-119351 A | 4/2004 |
| JP | 2004-179144 A | 6/2004 |
| JP | 2004-204114 A | 7/2004 |
| JP | 2004186111 A | 7/2004 |
| JP | 2004-535653 A | 11/2004 |
| JP | 2006-66294 A | 3/2006 |
| JP | 2006-68598 A | 3/2006 |
| JP | 2006-169265 A | 6/2006 |
| JP | 2006-348287 A | 12/2006 |
| JP | 2006-348288 A | 12/2006 |
| JP | 2007-503622 A | 2/2007 |
| TW | 200420710 A | 10/2004 |
| WO | 99/26286 A | 5/1999 |
| WO | WO 00/59267 A1 | 10/2000 |
| WO | 02/22710 A | 3/2002 |
| WO | WO 02/096970 A1 | 12/2002 |
| WO | 03/074587 A1 | 9/2003 |
| WO | WO 2005/056633 A1 | 6/2005 |
| WO | 2006/058182 A | 6/2006 |
| WO | 2006/087945 A1 | 8/2006 |
| WO | 2006/113205 A | 10/2006 |

OTHER PUBLICATIONS

Decision of Rejection, drafted Mar. 19, 2012, received from the Japanese Patent Office in corresponding Japanese Patent Application No. 2006-139741, along with an English translation thereof.
Notice of Reasons for Rejection issued Jun. 27, 2013 in Japanese Patent Application No. 2012-142778 with English translation.
Information Statement submitted Feb. 21, 2012 to the Japanese Patent Office by an anonymous third party, in Japanese Patent Application No. 2006-139741, along with an English translation thereof.
Information Statement submitted Feb. 21, 2012 to the Japanese Patent Office by an anonymous third party, in Japanese Patent Application No. 2006-139774, along with an English translation thereof.
Communication from the European Patent Office, dated Oct. 13, 2011, issued in corresponding European Application No. 06 746 610.2-2102.
Third Party Observation pursuant to Art. 115 EPC mailed Jul. 9, 2013 in corresponding European Patent Application No. 06746610.2 to Sumitomo Chemical Co., Ltd.
Partial machine-generated English translation of JP 2004-119351 to Dainippon Screen Mfg. Co., Ltd.
Notice of Preliminary Rejection issued Sep. 27, 2012 from the Korean Patent Office, in corresponding Korean Patent Application No. 10-2007-7026815, along with an English translation thereof.
Examination Report dated Aug. 15, 2012, received from the Taiwanese Patent Office in corresponding Taiwanese Patent Application No. 095117783, along with an English translation thereof.
Communication from the European Patent Office, dated Nov. 24, 2011, issued in corresponding European Application No. 10 007 569.6-2102.
Notice of Reasons for Rejection issued Dec. 3, 2012 in corresponding Japanese Patent Application No. 2012-142955 with English translation.
Machine-generated English translation of JP 2002-038007 published Feb. 6, 2002 to Toray Ind. Inc.
Machine-generated English translation of JP 2000-086906 published Mar. 28, 2000 to Toray Ind. Inc.
Communication, dated May 29, 2012, issued in the European Patent Office in corresponding European Patent Application No. 06 746 610.02-2101.
European Patent Office, "Communication Pursuant to Article 94(3) EPC," issued in connection with European Patent Application No. 06 746 610.2, dated Aug. 6, 2014.

* cited by examiner

POLYMER COMPOSITION AND POLYMER LIGHT-EMITTING DEVICE USING SAME

TECHNICAL FIELD

The present invention relates to a polymer composition and a polymer light-emitting device (hereinafter, sometimes referred to as a polymer LED) using the polymer composition.

BACKGROUND ART

Various light-emitting devices (polymer LEDs) comprising polymers as light-emitting materials have been under review.

There is a method of forming the light-emitting layer of a polymer LED by using a solution composition containing a polymer and a solvent by an inkjet method. This method is advantageous in that large-area light-emitting devices can be fabricated at a low cost.

Known examples of such a solution composition applicable to such an inkjet method include a solution composition containing a polyfluorene derivative and a solvent (Patent Document 1); a solution composition containing a poly arylene vinylene and a solvent (Patent Document 2); and a solution composition containing an aromatic ether compound and a low boiling point solvent (Patent Document 3). In addition, there is known a device fabricated by using a mixture of 4-methyl anisole, which is an aromatic ether compound, and 1,3,5-trimethylbenzene or 1,2,3,4-tetramethylbenzene, which has three or four substituents (Patent Document 4).

Patent Document 1: WO00/59267 pamphlet
Patent Document 2: WO02/96970 pamphlet
Patent Document 3: JP-A-2004-535653
Patent Document 4: JP-A-2003-308969

DISCLOSURE OF THE INVENTION

Problems to be Solved by the Invention

By the way, there is a problem that forming a thin film with a composition containing only a low melting point solvent or a solvent having a high solubility of polymers provides an ununiform film thickness. This problem is obvious on forming thin films by an inkjet method. Under these circumstances, there has been a desire for a composition use of which provides a uniform film thickness on forming a thin film.

Means for Solving the Problems

The present inventors have studied thoroughly in order to overcome the problem. The inventors have, as a result, found that a film with a uniform thickness is obtained by forming the film with a composition comprising an aromatic ether compound and a solvent having a boiling point equal to or higher than 200° C. and having a not so good solubility of polymers; or a composition comprising two or more types of organic compounds having boiling points equal to or higher than 100° C. in which at least one type of the organic compounds are solvents having boiling points equal to or higher than 200° C. and having a not so good solubility of polymers. Thus the present invention has been accomplished.

That is, the present invention provides

[1] A composition comprising one or more aromatic ether compounds, one or more compounds having boiling points equal to or higher than 200° C., and one or more polymers that transport charges or emit light in a solid state, characterized in that the compounds having boiling points equal to or higher than 200° C. are selected from the group consisting of aliphatic compounds that may optionally include a hetero atom, alicyclic compounds that may optionally include a hetero atom, aromatic compounds including two or less substituents, and heterocyclic compounds including two or less substituents; and

[2] A composition comprising two or more organic compounds having boiling points equal to or higher than 100° C. except for aromatic ether compounds, and one or more polymers that transport charges or emit light in a solid state, characterized in that at least one of the organic compounds are selected from aliphatic compounds that may optionally include a hetero atom and alicyclic compounds that may optionally include a hetero atom, the aliphatic compounds and the alicyclic compounds having boiling points equal to or higher than 200° C.

The composition according to the present invention has an advantage that use of the composition provides a film with a uniform thickness on forming the film.

BEST MODE FOR CARRYING OUT THE INVENTION

Figure 1:
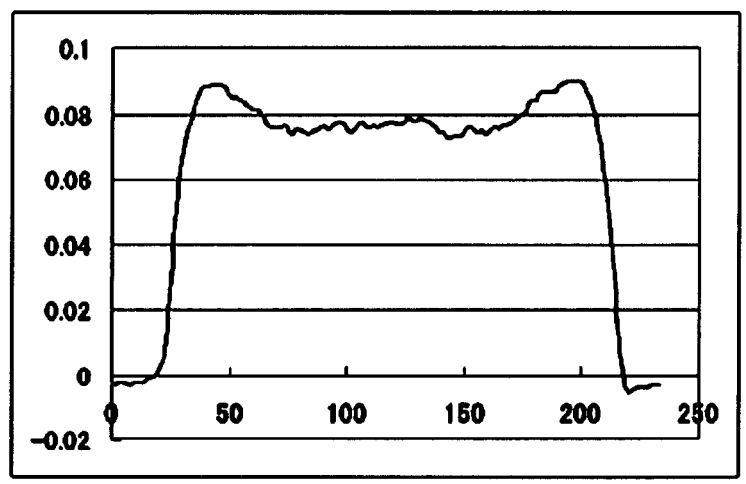
FIG. 1 shows a profile of a thin film formed with a composition 1 where the axis of abscissa indicates a distance (μm) of the film, and the axis of ordinate indicates a film thickness (μm) of the film.

A composition according to a first aspect of the present invention is a composition comprising one or more types of aromatic ether compounds, one or more types of compounds having boiling points equal to or higher than 200° C., and one or more types of polymers that transport charges or emit light in a solid state, characterized in that the compounds having boiling points equal to or higher than 200° C. are selected from the group consisting of aliphatic compounds that may optionally include a hetero atom, alicyclic compounds that may optionally include a hetero atom, aromatic compounds including two or less substituents, and heterocyclic compounds including two or less substituents.

Examples of the aromatic ether compounds contained in the composition according to the first aspect of the present invention may include: anisole, ethyl phenyl ether, propyl phenyl ether, butyl phenyl ether, methylanisole, dimethylanisole, ethylanisole, methylethylanisole, diethylanisole, propylanisole, butylanisole, pentylanisole, hexylanisole, heptylanisole, octylanisole, methyl naphthyl ether, and diphenyl ether.

The composition according to the first aspect of the present invention comprises one or more types of aromatic ether compounds. The composition preferably comprises one or two types of aromatic ether compounds, and more preferably one type of aromatic ether compounds for convenience in producing the composition.

The composition according to the first aspect of the present invention comprises 10 to 60 wt % of the aromatic ether compounds, and more preferably 20 to 50 wt % of the compounds based on the weight of the composition in view of properties of the composition such as solubility of the polymers, viscosity, or film formability.

The compounds having boiling points equal to or higher than 200° C. contained in the composition according to the first aspect of the present invention are compounds having boiling points equal to or higher than 200° C. among aliphatic compounds that may optionally include a hetero atom, alicyclic compounds that may optionally include a hetero atom, aromatic compounds including two or less substituents, or heterocyclic compounds including two or less substituents.

Examples of the aliphatic compounds that may optionally include a hetero atom may include: aliphatic hydrocarbon compounds, aliphatic alcohol compounds, aliphatic glycol compounds, aliphatic ester compounds, aliphatic compounds containing nitrogen atoms, and aliphatic compounds containing sulfur atoms.

Examples of the aliphatic hydrocarbon compounds may include: n-dodecane (boiling point: 216° C.), n-tridecane (boiling point: 234° C.), and n-tetradecane (boiling point: 252 to 254° C.).

Examples of the aliphatic alcohol compounds may include: 1-nonanol (boiling point: 211° C.), n-decanol (boiling point: 231° C.), 2-decanol (boiling point: 211° C.), n-undecanol (boiling point: 241° C.), isodecanol (boiling point: 220° C.), and n-tetradecanol (boiling point: 289° C.).

Examples of the aliphatic glycol compounds may include: diethylene glycol (boiling point: 244° C.), triethylene glycol (boiling point: 287° C.), triethylene glycol dimethyl ether (boiling point: 216° C.), tetraethylene glycol dimethyl ether (boiling point: 275° C.), ethylene glycol mono-2-ethylhexyl ether (boiling point: 229° C.), ethylene glycol monobutyl ether (boiling point: 231° C.), ethylene glycol monohexyl ether (boiling point: 208° C.), ethylene glycol monobenzyl ether (boiling point: 256° C.), dipropylene glycol (boiling point: 232° C.), tripropylene glycol (boiling point: 268° C.), 1,3-butanediol (boiling point: 208° C.), 1,4-butanediol (boiling point: 228° C.), neopentyl glycol (boiling point: 211° C.), 1,5-pentanediol (boiling point: 238 to 239° C.), and 1,6-hexanediol (boiling point: 250° C.).

Examples of the aliphatic ester compounds may include: n-octyl acetate (boiling point: 208° C.) and diethyl succinate (boiling point: 218° C.).

Examples of the aliphatic compounds containing nitrogen atoms may include acetamide (boiling point: 222° C.).

Examples of the aliphatic compounds containing sulfur atoms may include thiodiglycol (boiling point: 283° C.).

Examples of the alicyclic compounds that may optionally include a hetero atom may include: bicyclohexyl (boiling point: 226 to 228° C.), 2-(1-cyclohexenyl)cyclohexanone (boiling point: 265° C.), γ-butyrolactone (boiling point: 203 to 204° C.), propylene carbonate (boiling point: 242° C.), δ-valerolactone (boiling point: 218 to 220° C.), isophorone (boiling point: 215° C.), N-methylpyrrolidone (boiling point: 202° C.), 2-pyrrolidone (boiling point: 245° C.), and sulfolane (boiling point: 287° C.).

Examples of the aromatic compounds including two or less substituents may include: aromatic hydrocarbon compounds, aromatic alcohol compounds, aromatic ester compounds, and aromatic carboxyl compounds.

Examples of the aromatic hydrocarbon compounds may include: n-pentylbenzene (boiling point: 205° C.), n-hexylbenzene (boiling point: 226 to 227° C.), n-heptylbenzene (boiling point: 233° C.), n-octylbenzene (boiling point: 261 to 263° C.), n-nonalbenzene (boiling point: 282° C.), n-decylbenzene (boiling point: 293° C.), 1,3-di-isopropylbenzene (boiling point: 205° C.), 1,4-di-isopropylbenzene (boiling point: 205° C.), cyclohexylbenzene (boiling point: 239 to 240° C.), tetralin (boiling point: 207° C.), and biphenyl (boiling point: 255° C.).

Examples of the aromatic alcohol compounds may include: m-cresol (boiling point: 202° C.), p-cresol (boiling point: 202° C.), p-ethylphenol (boiling point: 218 to 219° C.), 4-methoxyphenol (boiling point: 246° C.), o-n-propylphenol (boiling point: 214° C.), o-isopropylphenol (boiling point: 215° C.), o-s-butylphenol (boiling point: 226 to 228° C.), o-t-butylphenol (boiling point: 224° C.), m-t-butylphenol (boiling point: 240° C.), p-t-butylphenol (boiling point: 237 to 239° C.), and benzyl alcohol (boiling point: 206° C.).

Examples of the aromatic ester compounds may include ethyl benzoate (boiling point: 212° C.) and n-butyl benzoate (boiling point: 250° C.).

Examples of the aromatic carboxyl compounds may include benzoic acid (boiling point: 249° C.) and phenylacetic acid (boiling point: 266° C.).

It is preferred that the aromatic compounds including two or less substituents are aromatic compounds including one or less substituents in view of film formability.

Examples of the heterocyclic compounds including two or less substituents may include quinoline (boiling point: 237° C.) and imidazole (boiling point: 257° C.).

A composition according to a first aspect of the present invention is a composition comprising one or more types of compounds having boiling points equal to or higher than 200° C. selected from the group consisting of aliphatic compounds that may optionally include a hetero atom, alicyclic compounds that may optionally include a hetero atom, aromatic compounds including two or less substituents, and heterocyclic compounds including two or less substituents. It is preferred that the composition comprises one to three types of the compounds, more preferably one or two types of the compounds, and still more preferably one type of the compounds for convenience in producing the composition.

The compounds having boiling points equal to or higher than 200° C. contained in a composition according to a first aspect of the present invention are preferably selected from aliphatic compounds that may optionally include a hetero atom, alicyclic compounds that may optionally include a hetero atom, and aromatic compounds including two or less substituents in view of film formability.

A composition according to a first aspect of the present invention preferably comprises 30 to 90 wt %, more preferably 40 to 80 wt % of the compounds having boiling points equal to or higher than 200° C., based on the weight of the composition in view of properties of the composition such as solubility of the polymers, viscosity, or film formability.

A composition according to the first aspect of the present invention may optionally comprise a compound (hereinafter, referred to as an additional compound) other than aromatic ether compounds and compounds having boiling points equal to or higher than 200° C. selected from the group consisting of aliphatic compounds that may optionally include a hetero atom, alicyclic compounds that may optionally include a hetero atom, aromatic compounds including two or less substituents, and heterocyclic compounds including two or less substituents. Examples of the additional compound may include: n-pentane, isopentane, n-hexane, isohexane, n-heptane, isoheptane, n-octane, isooctane, nonane, n-decane, n-undecane, methanol, ethanol, 1-propanol, 2-propanol, 1-butanol, 2-butanol, t-butanol, 1-pentanol, 2-pentanol, 1-hexanol, 2-hexanol, 1-heptanol, 2-heptanol, 1-octanol, 2-octanol, 2-nonanol, diisopropyl ether, dibutyl ether, ethylene glycol, ethylene glycol monoethyl ether, ethylene glycol diethyl ether, ethylene glycol monomethyl ether, ethylene glycol dimethyl ether, propylene glycol, propylene glycol monoethyl ether, propylene glycol monomethyl ether, hexylene glycol, methyl formate, ethyl formate, n-butyl formate, n-propyl formate, methyl acetate, ethyl acetate, allyl acetate, isopropyl acetate, n-butyl acetate, n-propyl acetate, dimethyl succinate, diethyl oxalate, dimethyl oxalate, methyl lactate, ethyl lactate, butyl lactate, methyl pyruvate, ethyl pyruvate, dimethyl malonate, diethyl malonate, dimethyl carbonate, acetaldehyde, propionaldehyde, butyraldehyde, furfural, acetone, methyl ethyl ketone, methyl isopropyl ketone, methyl isobutyl ketone, diisopropyl ketone, diisobutyl ketone, formic acid, acetic acid, oxalic acid, propionic acid, acetonitrile, N,N-dimethylacetamide, N,N-dimethylformamide, N,N-diisopropylethylamine, dimethyl sulfoxide, cyclopentane, cyclopentene, cyclohexane, methylcyclohexane, dimethylcyclohexane, ethylcyclohexane, cyclohexene, cycloheptane, decalin, cyclopentanol, cyclohexanol, methylcyclohexanol, dimethylcyclohexanol, cyclohexenol, cyclohexylmethanol, tetrahydrofurfuryl alcohol, furfuryl alcohol, cyclopentanone, cyclohexanone, methylcyclohexanone, dioxane, tetrahydrofuran, tetrahydropyran, benzene, toluene, o-xylene, p-xylene, m-xylene, mesitylene, 1,2,4-trimethylbenzene, tetramethylbenzene, ethylbenzene, o-diethylbenzene, m-diethylbenzene, p-diethylbenzene, 1,2,4-triethylbenzene, 1,3,5-triethylbenzene, tetraethylbenzene, O-ethylmethylbenzene, p-ethylmethylbenzene, m-ethylmethylbenzene, n-propyl benzene, isopropyl benzene, n-butylbenzene, s-butylbenzene, isobutylbenzene, t-butylbenzene, phenol, o-cresol, o-ethylphenol, 2,3-xylenol, 2,4-xylenol, 2,5-xylenol, 2,6-xylenol, 3,4-xylenol, 3,5-xylenol, 2,4-di-t-butylphenol, 2,6-di-t-butylphenol, 2-methyl-6-t-butylphenol, methyl benzoate, aniline and pyridine.

A composition of the present invention preferably comprises the additional composition in an amount of equal to or less than 40 wt %, more preferably equal to or less than 30 wt %, still more preferably equal to or less than 20 wt %, yet more preferably equal to or less than 10 wt %, and still yet more preferably equal to or less than 1 wt %.

A composition according to the first aspect of the present invention can be a liquid or a solid. In view of film formability, it is preferred that the composition is in a liquid state at 50° C., more preferably in a liquid state at 40° C., and still more preferably in a liquid state at 25° C. In view of storage stability, it is preferred that a solid matter does not precipitate at 20° C., more preferably a solid matter does not precipitate at 10° C., and still more preferably a solid matter does not precipitate at 0° C.

The compounds having boiling points equal to or higher than 200° C. contained in the composition according to the first aspect of the present invention preferably have melting points equal to or lower than 25° C., more preferably equal to or lower than 20° C., and still more preferably equal to or lower than 10° C. in view of storage stability.

A composition according to a second aspect of the present invention is a composition comprising two or more types of organic compounds having boiling points equal to or higher than 100° C. except for aromatic ether compounds, and one or more types of polymers that transport charges or emit light in a solid state, characterized in that at least one type of the organic compounds are aliphatic compounds or alicyclic compounds having boiling points equal to or higher than 200° C.

The aliphatic compounds with boiling points equal to or higher than 200° C. contained in a composition according to the second aspect of the present invention may optionally include a hetero atom. Examples of the aliphatic compounds may include: aliphatic hydrocarbon compounds, aliphatic alcohol compounds, aliphatic glycol compounds, aliphatic ester compounds, aliphatic compounds containing nitrogen atoms, and aliphatic compounds containing sulfur atoms. Examples of the aliphatic hydrocarbon compounds, the aliphatic alcohol compounds, the aliphatic glycol compounds, the aliphatic ester compounds, the aliphatic compounds containing nitrogen atoms, and the aliphatic compounds containing sulfur atoms are described above.

It is preferred that the aliphatic compounds are aliphatic hydrocarbon compounds, aliphatic alcohol compounds, aliphatic glycol compounds, or aliphatic ester compounds, more preferably aliphatic hydrocarbon compounds or aliphatic alcohol compounds in view of film formability.

The alicyclic compounds with boiling points equal to or higher than 200° C. contained in a composition according to the second aspect of the present invention may optionally include a hetero atom. Examples of the alicyclic compounds may include: alicyclic hydrocarbon compounds, alicyclic ketone compounds, alicyclic lactone compounds, alicyclic carbonate compounds, alicyclic compounds containing nitrogen atoms, and alicyclic compounds containing sulfur atoms. Examples of the alicyclic hydrocarbon compounds may include bicyclohexyl (boiling point: 226 to 228° C.). Examples of the alicyclic ketone compounds may include 2-(1-cyclohexenyl)cyclohexanone (boiling point: 265° C.) and isophorone (boiling point: 215° C.). Examples of the alicyclic lactone compounds may include γ-butyrolactone (boiling point: 203 to 204° C.) and δ-valerolactone (boiling point: 218 to 220° C.). Examples of the aliphatic carbonate compounds may include propylene carbonate (boiling point: 242° C.). Examples of the alicyclic compounds containing nitrogen atoms may include N-methylpyrrolidone (boiling point: 202° C.) and 2-pyrrolidone (boiling point: 245° C.). Examples of the alicyclic compounds containing sulfur atoms may include sulfolane (boiling point: 287° C.). In view of the film formability of the composition, the alicyclic compounds are preferably composed of only carbon atoms, hydrogen atoms, and oxygen atoms. More preferably, the alicyclic compounds are bicyclohexyl and 2-(1-cyclohexenyl)cyclohexanone.

A composition according to the second aspect of the present invention comprises one or more types of aliphatic compounds or alicyclic compounds having boiling points equal to or higher than 200° C. The composition preferably comprises one to three types of the aliphatic compounds or the alicyclic compounds, and more preferably one or two types of the aliphatic compounds or the alicyclic compounds for convenience in producing the composition.

The aliphatic compounds and the alicyclic compounds having boiling points equal to or higher than 200° C. contained in a composition according to the second aspect of the present invention preferably have boiling points equal to or higher than 220° C. in view of forming uniform films.

A composition according to the second aspect of the present invention preferably comprises the aliphatic compounds or the alicyclic compounds having boiling points equal to or higher than 200° C. in weights equal to or greater than 30 wt %, and more preferably equal to or greater than 40 wt % based on the weight of the composition in view of properties of the composition such as solubility of the polymers, viscosity, or film formability.

A composition according to the second aspect of the present invention is characterized by comprising at least one type of an organic compound having a boiling point equal to or higher than 100° C. in addition to the aliphatic compounds or the alicyclic compounds having boiling points equal to or higher than 200° C.

Examples of the organic compound having boiling points equal to or higher than 100° C. may include: aliphatic hydrocarbon compounds, aliphatic alcohol compounds, aliphatic ether compounds, aliphatic glycol compounds, aliphatic ester compounds, aliphatic aldehyde compounds, aliphatic ketone compounds, aliphatic carboxyl compounds, aliphatic compounds containing nitrogen atoms, aliphatic compounds containing sulfur atoms, alicyclic compounds, alicyclic compounds containing hetero atoms, aromatic hydrocarbon compounds, aromatic alcohol compounds, aromatic ester compounds, aromatic aldehyde compounds, and aromatic carboxyl compounds.

Examples of the aliphatic hydrocarbon compounds may include: n-octane (boiling point: 126° C.), nonane (boiling point: 151° C.), n-decane (boiling point: 174° C.), and n-undecane (boiling point: 196° C.) in addition to the aliphatic compounds having boiling points equal to or higher than 200° C. mentioned above.

Examples of the aliphatic alcohol compounds may include: 1-butanol (boiling point: 116 to 118° C.), 1-pentanol (boiling point: 136 to 138° C.), 2-pentanol (boiling point: 118 to 119° C.), 1-hexanol (boiling point: 157° C.), 2-hexanol (boiling point: 136° C.), 1-heptanol (boiling point: 176° C.), 2-heptanol (boiling point: 160 to 162° C.), 1-octanol (boiling point: 196° C.), 2-octanol (boiling point: 174 to 181° C.), and 2-nonanol (boiling point: 193 to 194° C.) in addition to the aliphatic compounds having boiling points equal to or higher than 200° C. mentioned above.

Examples of the aliphatic ether compounds may include dibutyl ether (boiling point: 137 to 143° C.).

Examples of the aliphatic glycol compounds may include: ethylene glycol (boiling point: 197° C.), ethylene glycol monoethyl ether (boiling point: 135° C.), ethylene glycol diethyl ether (boiling point: 124° C.), ethylene glycol monomethyl ether (boiling point: 124° C.), propylene glycol (boiling point: 187° C.), propylene glycol monoethyl ether, propylene glycol monomethyl ether (boiling point: 119 to 122° C.), and hexylene glycol (boiling point: 198° C.) in addition to the aliphatic compounds having boiling points equal to or higher than 200° C. mentioned above.

Examples of the aliphatic ester compounds may include: n-butyl formate (boiling point: 107° C.), allyl acetate (boiling point: 103 to 104° C.), n-butyl acetate (boiling point: 120 to 125° C.), dimethyl succinate (boiling point: 195° C.), diethyl oxalate (boiling point: 185° C.), dimethyl oxalate (boiling point: 134 to 137° C.), methyl lactate (boiling point: 145° C.), ethyl lactate (boiling point: 154° C.), methyl pyruvate (boiling point: 165° C.), ethyl pyruvate (boiling point: 156° C.), dimethyl malonate (boiling point: 181° C.), and diethyl malonate (boiling point: 198 to 199° C.) in addition to the aliphatic compounds having boiling points equal to or higher than 200° C. mentioned above.

Examples of the aliphatic aldehyde compounds may include furfural (boiling point: 161° C.).

Examples of the aliphatic ketone compounds may include: methyl isobutyl ketone (boiling point: 118° C.), diisopropyl ketone (boiling point: 124° C.), and diisobutyl ketone (boiling point: 163 to 173° C.).

Examples of the aliphatic carboxyl compounds may include: formic acid (boiling point: 101° C.), acetic acid (boiling point: 117 to 118° C.), and propionic acid (boiling point: 141° C.).

Examples of the aliphatic compounds containing nitrogen atoms may include: N,N-dimethylacetamide (boiling point: 165 to 166° C.), N,N-dimethylformamide (boiling point: 153° C.), and N,N-diisopropylethylamine (boiling point: 127° C.) in addition to the aliphatic compounds having boiling points equal to or higher than 200° C. mentioned above.

Examples of the aliphatic compounds containing sulfur atoms may include dimethyl sulfoxide (boiling point: 189° C.) in addition to the aliphatic compounds having boiling points equal to or higher than 200° C. mentioned above.

Examples of the alicyclic compounds may include: methylcyclohexane (boiling point: 101° C.), dimethylcyclohexane (boiling point: 120 to 129° C.), ethylcyclohexane (boiling point: 132° C.), cycloheptane (boiling point: 116 to 118° C.), and decalin (boiling point: 187 to 195° C.) in addition to the alicyclic compounds having boiling points equal to or higher than 200° C. mentioned above.

Examples of the alicyclic compounds containing hetero atoms may include: cyclopentanol (boiling point: 139 to 140° C.), cyclohexanol (boiling point: 160 to 161° C.), methylcyclohexanol (boiling point: 171 to 173° C.), dimethylcyclohexanol (boiling point: 186° C.), cyclohexenol (boiling point: 164 to 166° C.), cyclohexylmethanol (boiling point: 181° C.), tetrahydrofurfuryl alcohol (boiling point: 178° C.), furfuryl alcohol (boiling point: 170 to 171° C.), cyclopentanone (boiling point: 130 to 131° C.), cyclohexanone (boiling point: 155° C.), dioxane (boiling point: 102° C.), and methylcyclohexanone (boiling point: 162 to 171° C.) in addition to the alicyclic compounds having boiling points equal to or higher than 200° C. mentioned above. Preferred alicyclic compounds containing hetero atoms are cyclopentanol, cyclohexanol, methylcyclohexanol, dimethylcyclohexanol, cyclopentanone, and cyclohexanone in view of the properties of the composition such as film formability.

Examples of the aromatic hydrocarbon compounds may include: toluene (boiling point: 111° C.), o-xylene (boiling point: 143 to 145° C.), p-xylene (boiling point: 138° C.), m-xylene (boiling point: 138 to 139° C.), mesitylene (162 to 164° C.), 1,2,4-trimethylbenzene (boiling point: 168° C.), ethylbenzene (boiling point: 136° C.), o-diethylbenzene (boiling point: 183 to 184° C.), m-diethylbenzene (boiling point: 181° C.), p-diethylbenzene (boiling point: 184° C.), o-ethylmethylbenzene (boiling point: 164 to 165° C.), p-ethylmethylbenzene (boiling point: 162° C.), m-ethylmethylbenzene (boiling point: 161° C.), n-propyl benzene (boiling point: 159° C.), isopropyl benzene (boiling point: 153° C.), n-butylbenzene (boiling point: 183° C.), s-butylbenzene (boiling point: 173° C.), isobutylbenzene (boiling point: 173° C.), t-butylbenzene (boiling point: 169° C.), n-pentylbenzene (boiling point: 205° C.), n-hexylbenzene (boiling point: 226 to 227° C.), n-heptylbenzene (boiling point: 233° C.), n-octylbenzene (boiling point: 261 to 263° C.), n-nonalbenzene (boiling point: 282° C.), n-decylbenzene (boiling point: 293° C.), 1,3-di-isopropylbenzene (boiling point: 205° C.), 1,4-di-isopropylbenzene (boiling point: 205° C.), cyclohexylbenzene (boiling point: 239 to 240° C.), tetralin (boiling point: 207° C.), and biphenyl (boiling point: 255° C.)

Examples of the aromatic alcohol compounds may include: phenol (boiling point: 182° C.), o-cresol (boiling point: 190 to 195° C.), o-ethylphenol (boiling point: 195 to 197° C.), m-cresol (boiling point: 202° C.), p-cresol (boiling point: 202° C.), p-ethylphenol (boiling point: 218 to 219° C.), 4-methoxyphenol (boiling point: 246° C.), o-n-propylphenol (boiling point: 214° C.), o-isopropylphenol (boiling point: 215° C.), o-s-butylphenol (boiling point: 226 to 228° C.), o-t-butylphenol (boiling point: 224° C.), m-t-butylphenol (boiling point: 240° C.), p-t-butylphenol (boiling point: 237 to 239° C.), and benzyl alcohol (boiling point: 206° C.)

Examples of the aromatic ester compounds may include: methyl benzoate (boiling point: 199° C.), ethyl benzoate (boiling point: 212° C.), and n-butyl benzoate (boiling point: 250° C.)

Examples of the aromatic aldehyde compounds may include benzaldehyde (boiling point: 178° C.).

Examples of the aromatic carboxyl compounds may include benzoic acid (boiling point: 249° C.) and phenylacetic acid (boiling point: 266° C.).

In view of the properties of the composition such as film formability, preferred organic compounds having boiling points equal to or higher than 100° C. are aliphatic hydrocarbon compounds, aliphatic alcohol compounds, aliphatic ester compounds, aliphatic ketone compounds, alicyclic compounds, alicyclic compounds containing hetero atoms, aromatic hydrocarbon compounds, aromatic alcohol compounds, and aromatic ester compounds.

A composition according to the second aspect of the present invention comprising an aromatic compound except for aromatic ether compounds preferably has a boiling point equal to or lower than 250° C., and more preferably equal to or lower than 220° C. in view of forming uniform films. The aromatic compound preferably has a lower boiling point than aliphatic compounds or alicyclic compounds having boiling points equal to or higher than 200° C. contained in the composition.

A composition according to the second aspect of the present invention is characterized by comprising two or more types of organic compounds having boiling points equal to or higher than 100° C. In view of viscosity, the organic compounds preferably have boiling points equal to or higher than 120° C., more preferably equal to or higher than 150° C., and still more preferably equal to or higher than 170° C.

A composition according to the second aspect of the present invention may optionally comprise a compound except for aromatic ether compounds in addition to the organic compounds having boiling points equal to or higher than 100° C. Examples of such a compound may include compounds having boiling points lower than 100° C. The composition preferably contains the compound in an amount equal to or less than 20 wt %, more preferably equal to or less than 10 wt %, and still more preferably equal to or less than 1 wt % based on the weight of the composition of the present invention.

A composition according to the second aspect of the present invention can be a liquid or a solid. In view of film formability, it is preferred that the composition is in a liquid state at 50° C., more preferably in a liquid state at 40° C., and still more preferably in a liquid state at 25° C. In view of storage stability, it is preferred that a solid matter does not precipitate at 20° C., more preferably a solid matter does not precipitate at 10° C., and still more preferably a solid matter does not precipitate at 0° C.

The aliphatic compounds and the alicyclic compounds having boiling points equal to or higher than 200° C. contained in the composition according to the second aspect of the present invention preferably have melting points equal to or lower than 25° C., more preferably equal to or lower than 20° C., and still more preferably equal to or lower than 10° C. in view of storage stability.

The polymers contained in compositions according to the present invention preferably have number average molecular weights of $1.0 \times 10^3$ to $1.0 \times 10^7$, more preferably $5.0 \times 10^3$ to $1.0 \times 10^6$, and still more preferably $1.0 \times 10^4$ to $2.0 \times 10^5$ in view of properties of the compositions such as solubility, viscosity, and film formability.

The polymers contained in the compositions according to the present invention preferably have weight average molecular weights of $1.0 \times 10^3$ to $1.0 \times 10^7$, more preferably $1.0 \times 10^4$ to $2.0 \times 10^6$, and still more preferably $5.0 \times 10^4$ to $1.0 \times 10^6$ in view of properties of the compositions such as solubility, viscosity, and film formability.

The compositions according to the present invention preferably comprises 0.1 to 5 wt % of the polymers, more preferably 0.5 to 2 wt % based on the weight of the compositions in view of properties of the compositions such as solubility, viscosity, and a cost for forming films.

A composition according to the present invention preferably has a viscosity of 1 to 20 mPa·s, and more preferably 3 to 15 mPa·s at 25° C. in view of properties of the composition such as film formability.

The polymers contained in the compositions according to the present invention are not particularly restricted as long as the polymers transport charges or emit light in a solid state. The charge transport polymers are polymers that transport negative charges (electrons) or positive charges (holes), and the polymers may transport both electrons and holes. Charge transport can be tested by a technique of determining charge transport by using cyclic voltammetry, a technique of fabricating a device and testing charge transport there or various techniques known in the art. Electrons and holes can recombine in the polymers that transport charges to emit electroluminescence. Examples of the polymers that emit light in a solid state may include polymers that emit fluorescence in a solid state and polymers that emit phosphorescence in a solid state. The polymers that emit light in a solid state may transport charges or emit electroluminescence.

Thin films formed with the compositions according to the present invention are applicable to various uses such as polymer electroluminescence, organic transistors, polymer capacitors, secondary batteries, solar cells, sensors, thermoelectric transducers, capacitors, actuators, antistatic agents, gas separation membranes, electromagnetic shielding, lasers, electrophotographic photosensitive materials, or organic super conductors. Polymers contained in the compositions are selected appropriately according to the uses of the compositions.

As for the use for polymer LEDs, light-emitting layers, electron transport layers, and hole transport layers can be formed with compositions according to the present invention.

When light-emitting layers are formed with compositions according to the present invention, the polymers contained in the compositions preferably include at least one repeating unit among arylene groups, divalent heterocyclic groups, divalent groups having metal complex structures, and divalent aromatic amines.

The polymers with the repeating unit(s) may further comprise structures represented by $-CR_{a1}=CR_{a2}-$, $-C\equiv C-$, $-N(R_{a3})-$, or $-(SiR_{a4}R_{a5})_b-$ without impairing the light-emitting property. $R_{a1}$ and $R_{a2}$ independently represent a hydrogen atom, an alkyl group, an aryl group, a monovalent heterocyclic group, a carboxyl group, a substituted carboxyl group, or a cyano group. $R_{a3}$, $R_{a4}$, and $R_{a5}$ independently represent a group including a hydrogen atom, an alkyl group, an aryl group, a monovalent heterocyclic group, an arylalkyl group, or a substituted amino group. b represents an integer of 1 to 12. When any of $R_{a1}$, $R_{a2}$, $R_{a3}$, $R_{a4}$, and $R_{a5}$ are two or more, these Rs may be the same or different.

The arylene group used herein refers to an atom group obtained by removing two hydrogen atoms from an aromatic hydrocarbon and includes an arylene group having a condensed ring, and an aryl group having two or more independent benzene rings or condensed rings directly joined thereto or joined via a group such as vinylene. The arylene group may have a substituent. The type of substituent is not particularly limited. In view of solubility, fluorescent properties, ease of synthesis and characteristics of the resultant device, preferable examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group and cyano group.

The number of carbon atoms of the arylene group except a substituent is generally about 6 to 60, and preferably 6 to 20. The total number of carbon atoms of the arylene group including that of a substituent is generally about 6 to 100.

Examples of the arylene group include a phenylene group (for example, the following formulas 1 to 3), naphthalene-diyl group (the following formulas 4 to 13), anthracene-diyl group (the following formulas 14 to 19), biphenyl-diyl group (the following formulas 20 to 25), fluorene-diyl group (the following formulas 36 to 38), terphenyl-diyl group (the following formulas 26 to 28), condensed ring compound group (the following formulas 29 to 35), stilbene-diyl (the following formulas A to D), distilbene-diyl (the following formulas E and F) and indenonaphthalene-diyl (the following formulas G to N).

[Formula 1]

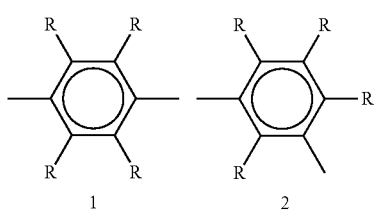

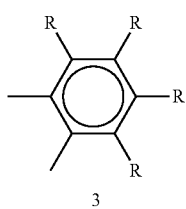

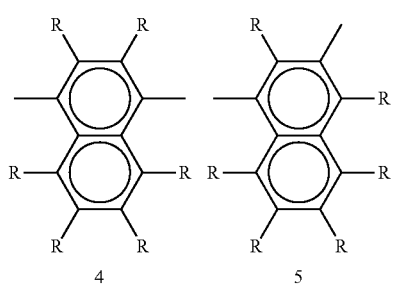

[Formula 2]

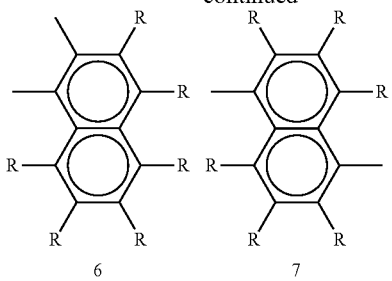

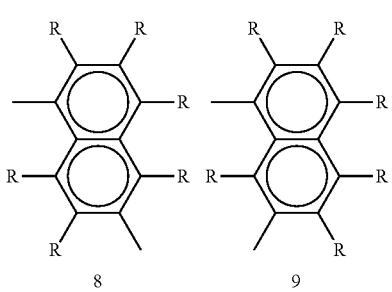

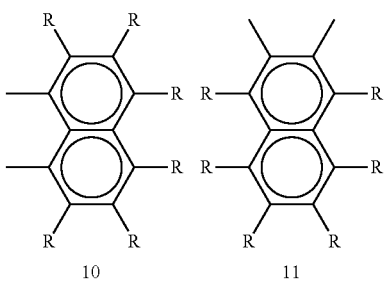

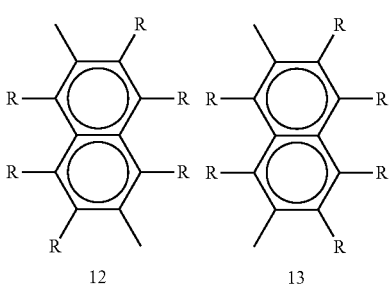

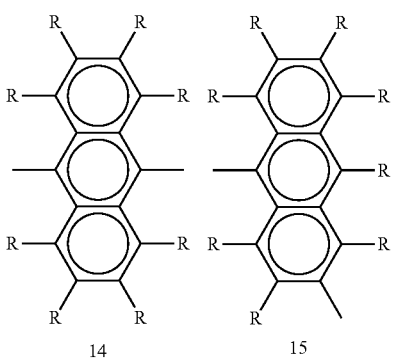

[Formula 3]
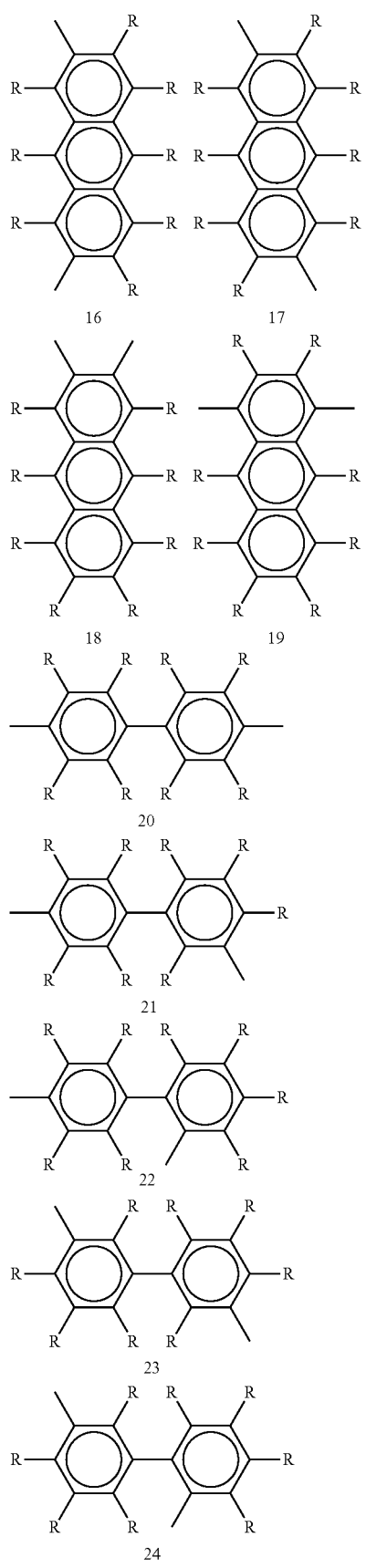
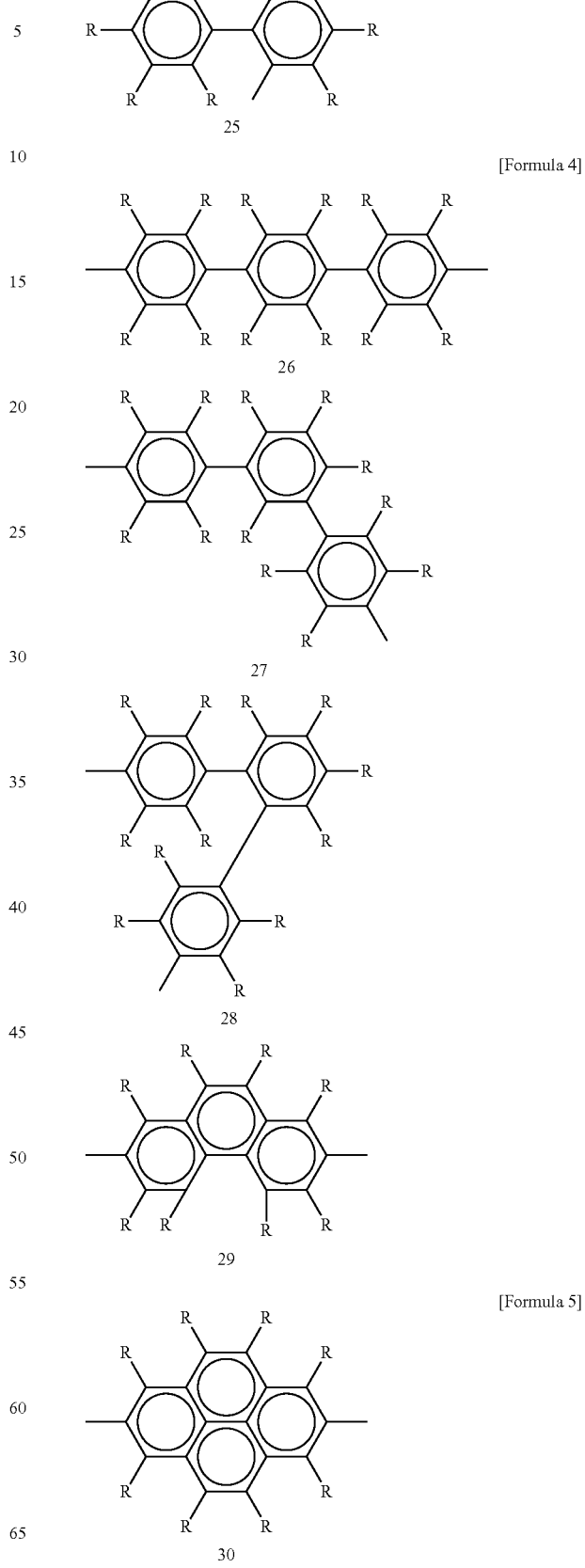
[Formula 4]
[Formula 5]

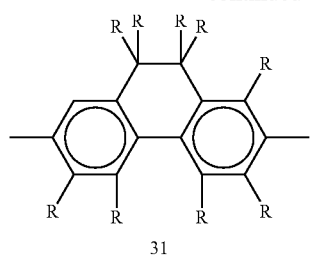
31
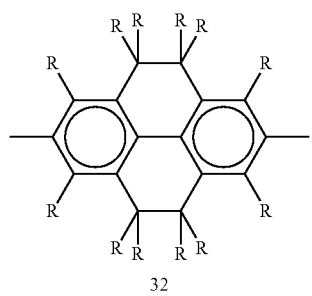
32
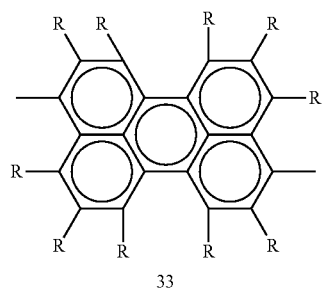
33
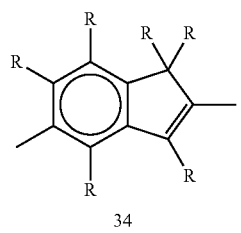
34
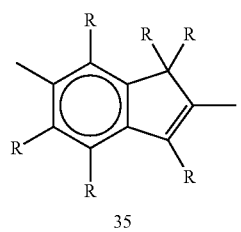
35
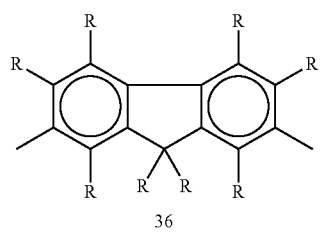
36
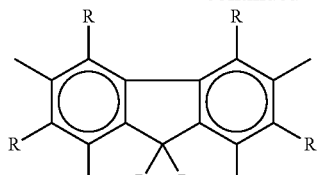
37
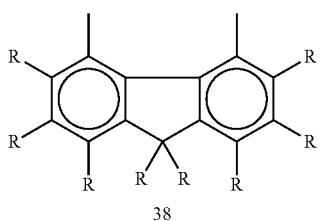
38
[Formula 6-1]
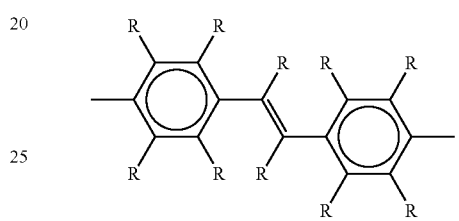
A
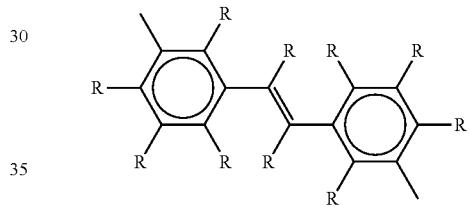
B
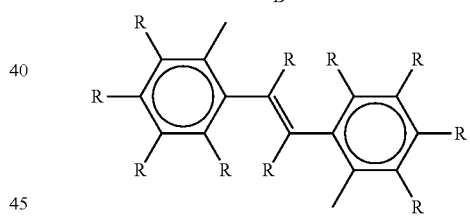
C
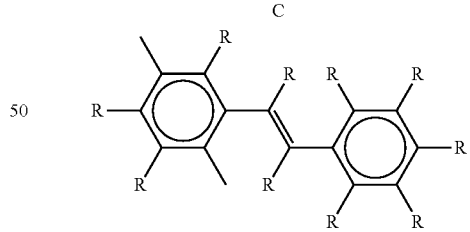
D
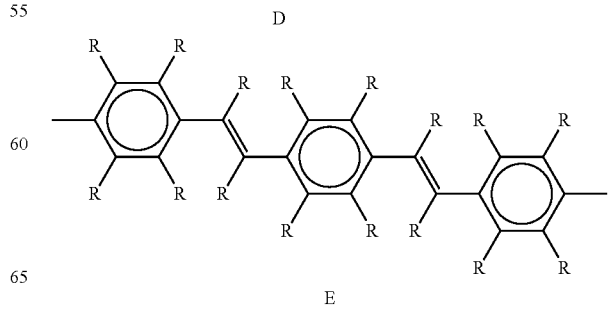
E

[Formula 6-2]

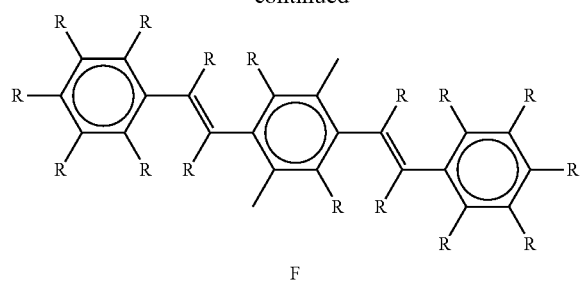
F

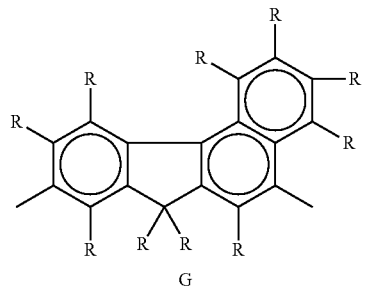
G

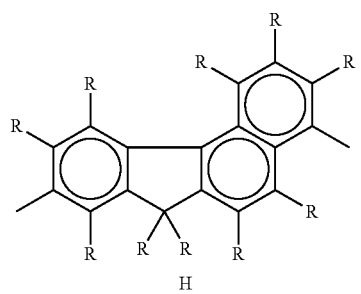
H

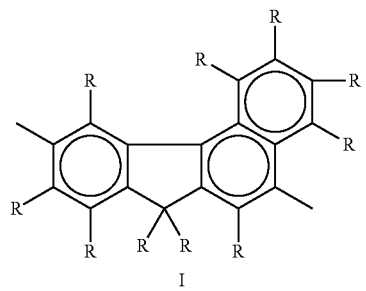
I

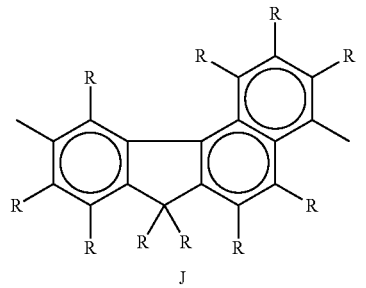
J

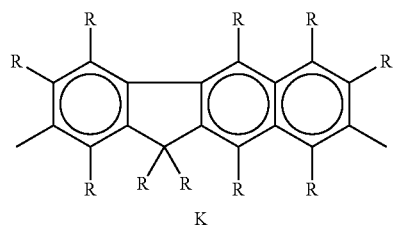
K

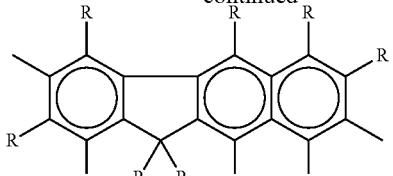
L

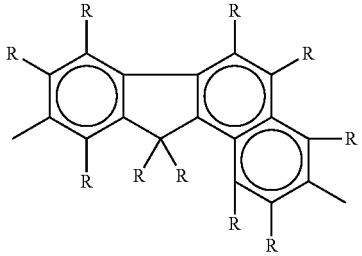
M

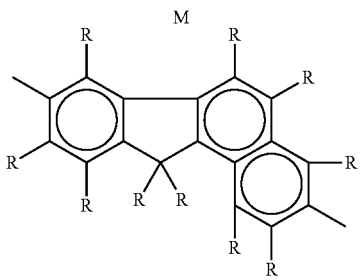
N

The divalent heterocyclic group refers to the remaining atom group obtained by removing two hydrogen atoms from a heterocyclic compound and may have a substituent.

The heterocyclic compound refers to an organic compound having a ring structure which may not be necessarily constituted of carbon atoms alone and may include a hetero atom such as oxygen, sulfur, nitrogen, phosphorus, boron or arsenic. Of the divalent heterocyclic groups, an aromatic heterocyclic group is preferable. The type of substituent is not particularly limited; however, in view of solubility, fluorescent properties, ease of synthesis and characteristics of the resultant device, preferable examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group and cyano group.

The number of carbon atoms of the divalent heterocyclic group except that of a substituent is generally about 3 to 60. The total number of carbon atoms of the divalent heterocyclic group including that of a substituent is generally about 3 to 100.

Examples of the divalent heterocyclic group include
divalent pyridine-diyl groups (the following formulas 39 to 44),
diazaphenylene groups (the following formulas 45 to 48),
quinolinediyl groups (the following formulas 49 to 63),
quinoxalinediyl groups (the following formulas 64 to 68),
acridinediyl groups (the following formulas 69 to 72),
bipyridyldiyl groups (the following formulas 73 to 75), and
phenanthrolinediyl groups (the following formulas 76 to 78) containing nitrogen as a hetero atom;

groups having a fluorene structure and containing oxygen, silicon, nitrogen, selenium or sulfur, etc., as a hetero atom (the following formulas 79 to 93);

5-membered heterocyclic groups containing oxygen, silicon, nitrogen, sulfur, selenium, boron or phosphorus, etc., as a hetero atom (the following formulas 94 to 98, O to Z, and AA to AC);

5-membered condensed heterocyclic groups containing oxygen, silicon, nitrogen, sulfur, selenium or sulfur, etc., as a hetero atom (the following formulas 99 to 110);

dimmers or oligomers formed of 5-membered heterocyclic groups containing oxygen, silicon, nitrogen, sulfur or selenium, etc., as a hetero atom and joined at the α-position of the hetero atom the following formulas 111 and 112);

5-membered heterocyclic groups containing oxygen, silicon, nitrogen, sulfur or selenium, etc., as a hetero atom and joined to a phenyl group at the α-position of the hetero atom (the following formulas 113 to 119);

5-membered condensed heterocyclic groups containing oxygen, nitrogen or sulfur, etc., as a hetero atom and substituted with a phenyl group, furyl group, thienyl group (the following formulas 120 to 125); and 6-membered heterocyclic groups (the following formulas AD to AG) containing oxygen and nitrogen as hetero atoms.

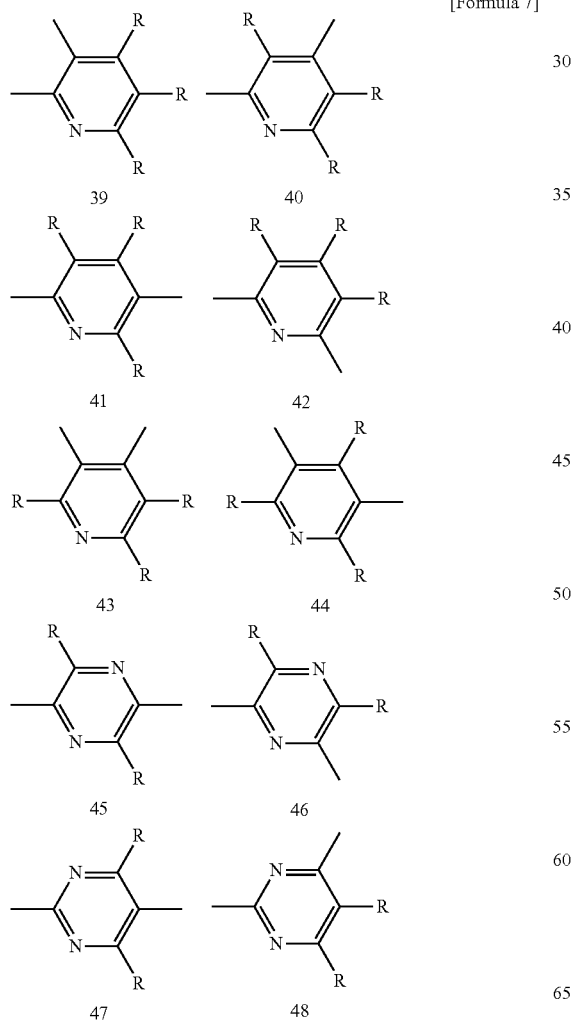

[Formula 7]

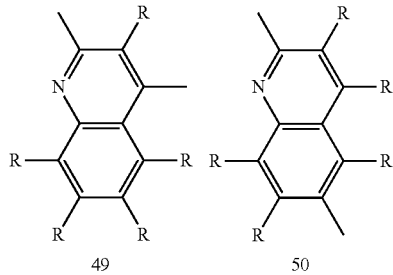

[Formula 8]

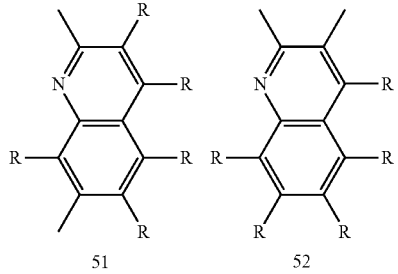

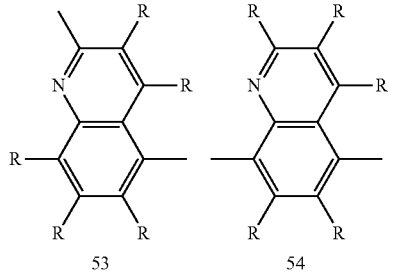

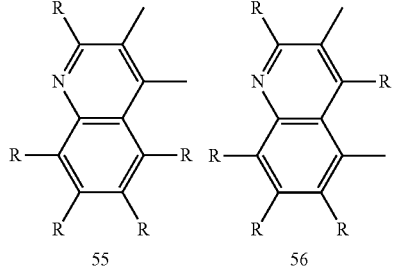

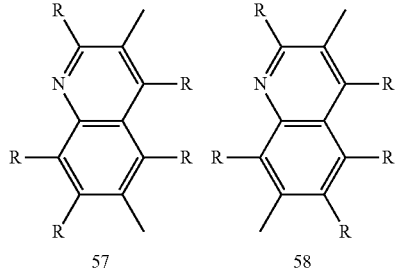

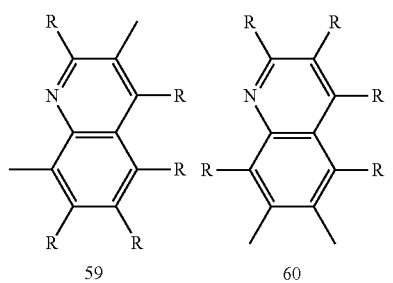

[Formula 9]

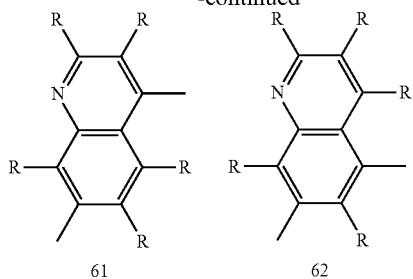
61  62
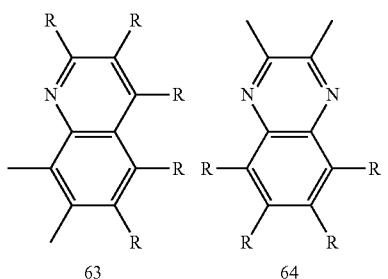
63  64
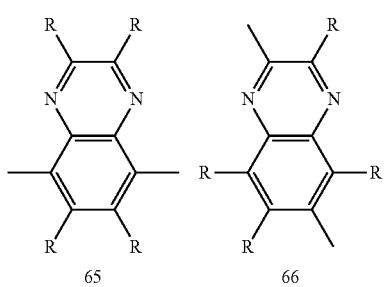
65  66
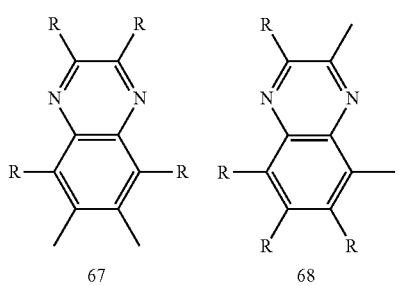
67  68
[Formula 10]
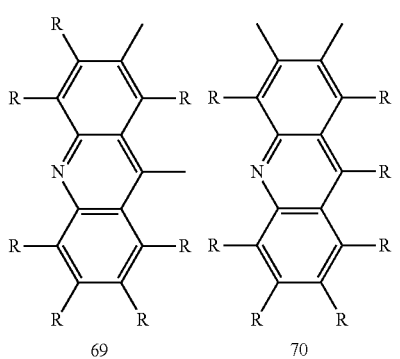
69  70
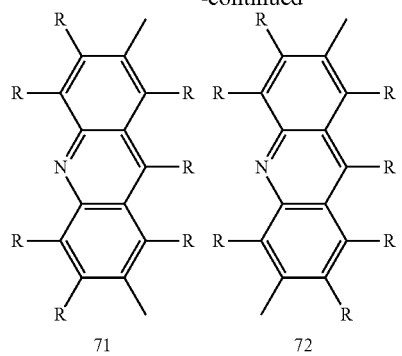
71  72
[Formula 11]
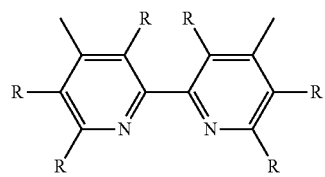
73
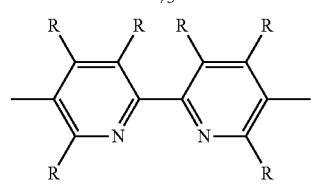
74
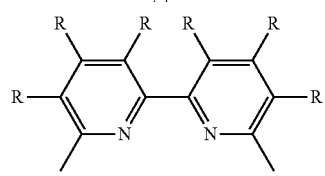
75
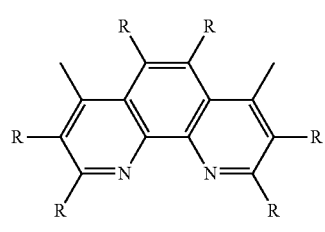
76
77
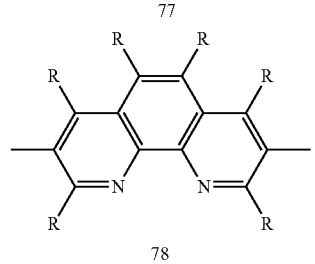
78

[Formula 12]
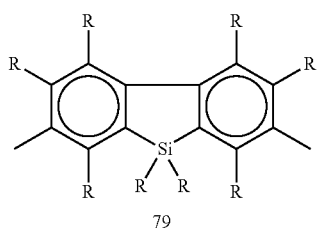
79
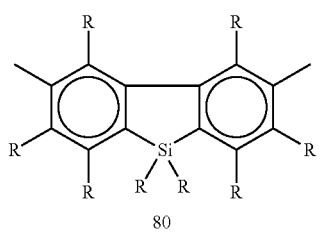
80
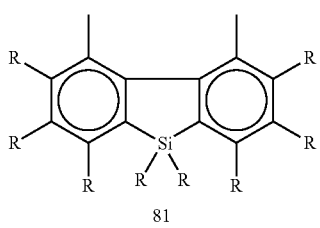
81
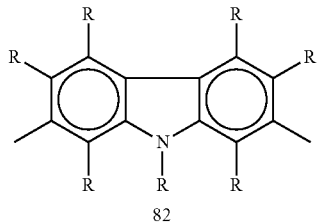
82
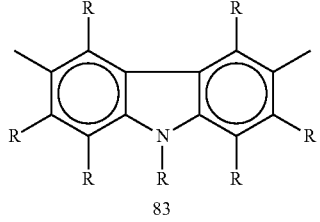
83
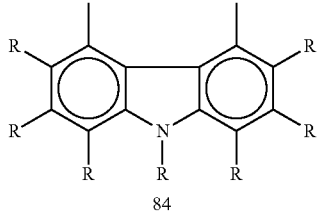
84
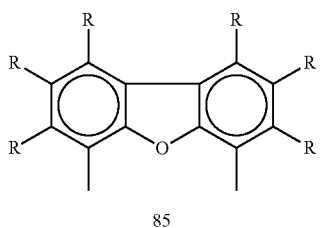
85
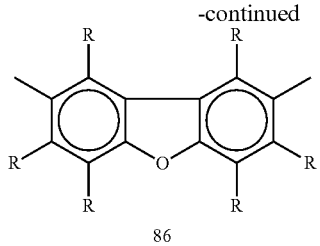
86
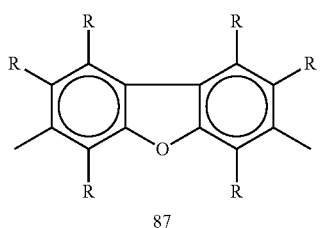
87
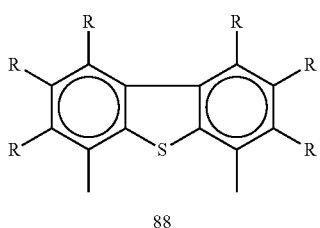
88
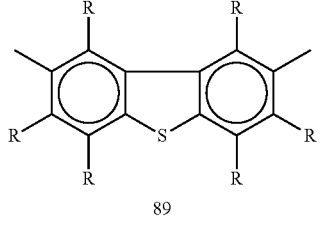
89
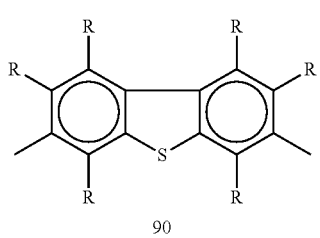
90
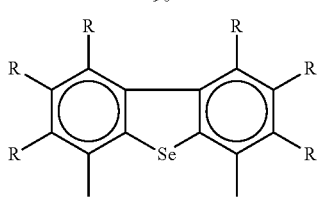
91
[Formula 13]
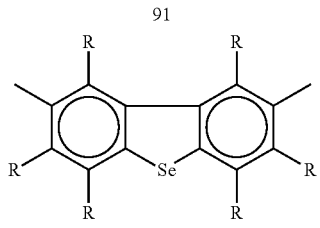
92

[Formula 14]
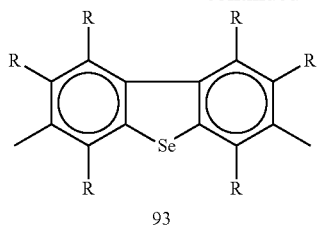
93
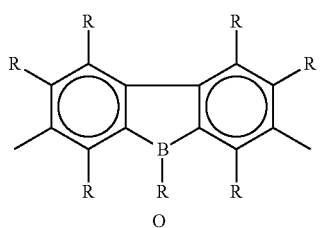
O
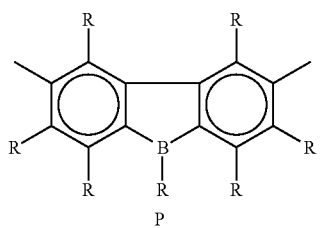
P
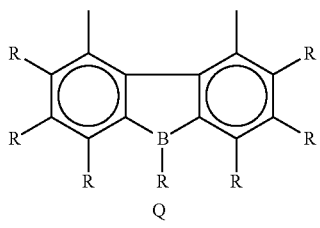
Q
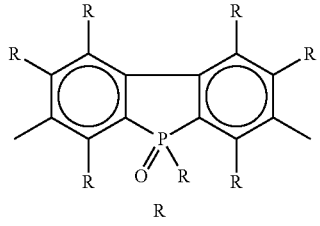
R
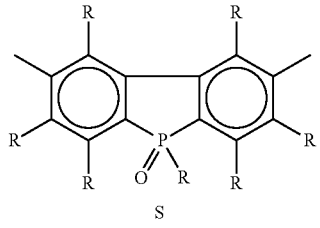
S
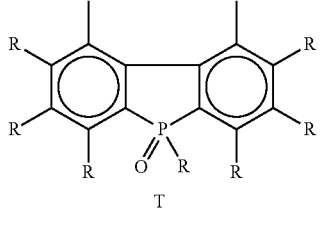
T
[Formula 15]
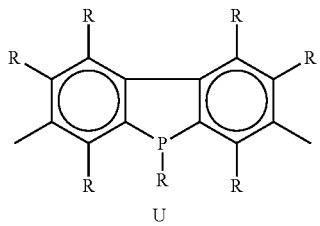
U
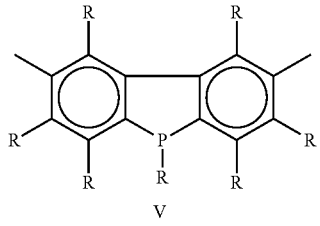
V
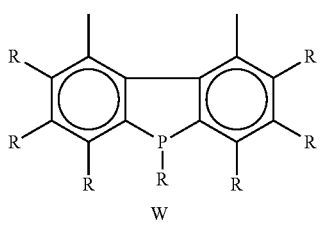
W
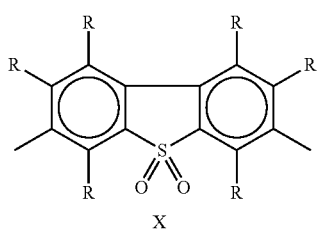
X
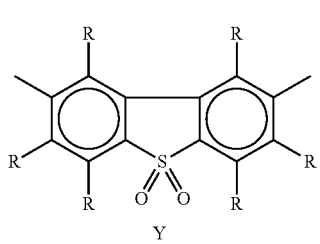
Y
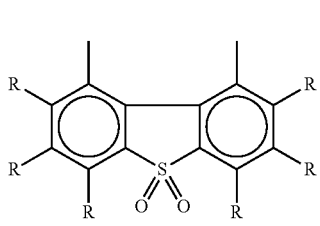
Z
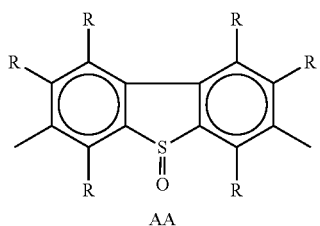
AA -continued
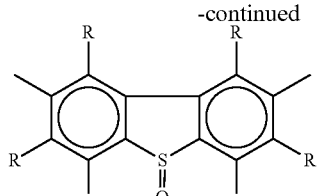
AB
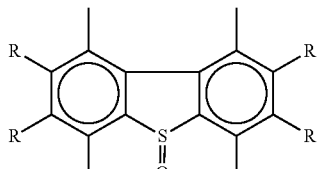
AC
[Formula 16]
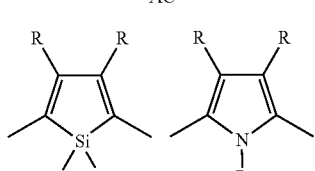
94  95
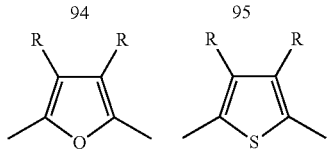
96  97
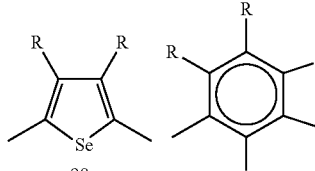
98  99
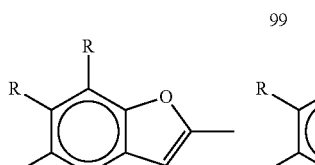
100  101
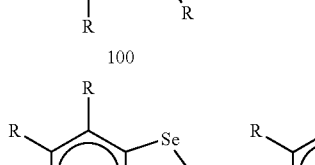
102  103
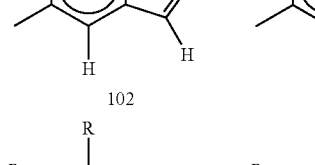
104  105
-continued
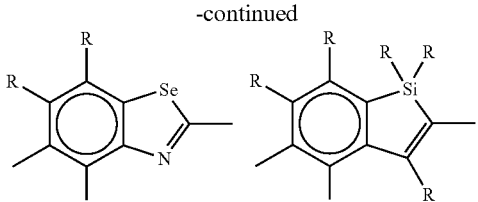
106  107
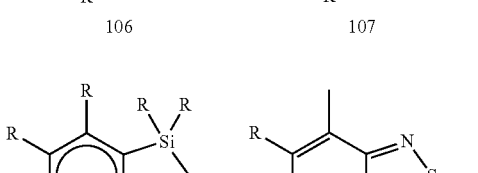
108  109
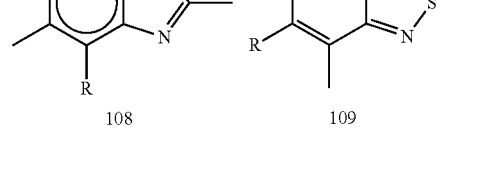
110
[Formula 17]
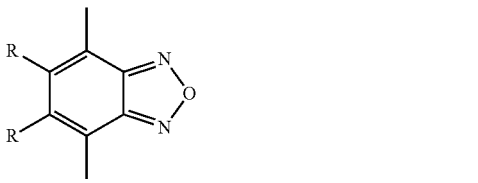
111
112
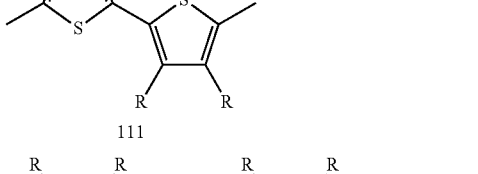
113
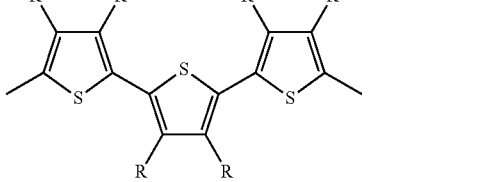
114

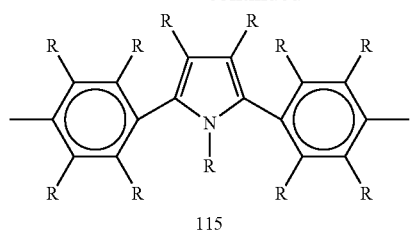
115
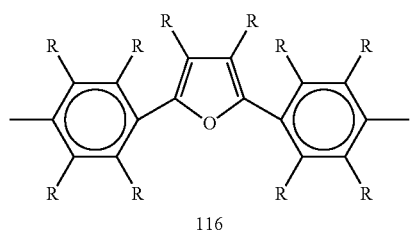
116
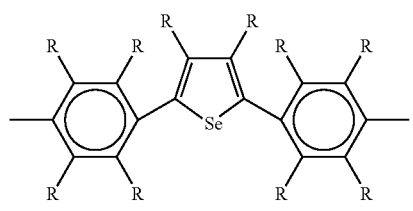
117
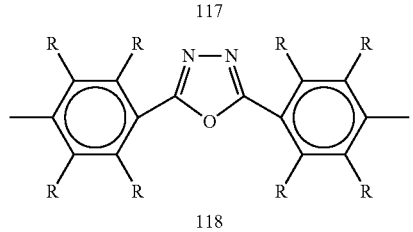
118
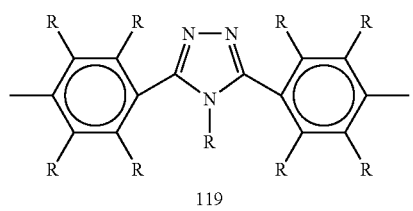
119
[Formula 18]
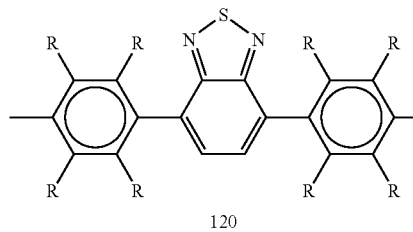
120
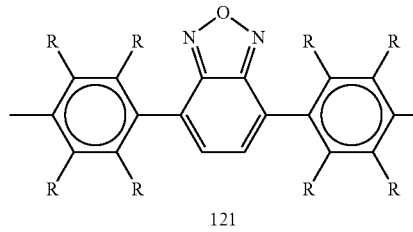
121
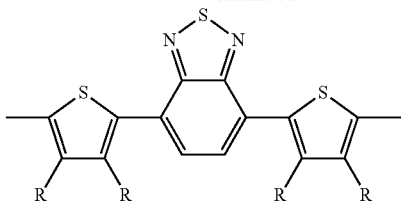
122
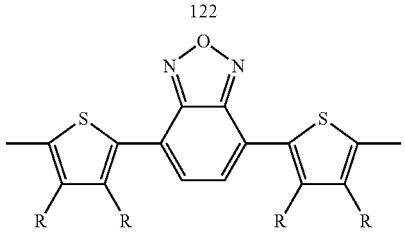
123
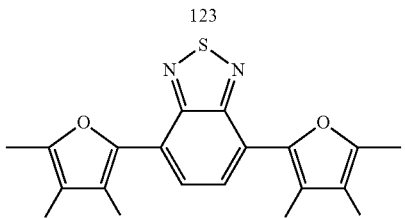
124
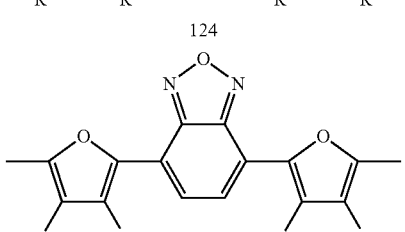
125
[Formula 19]
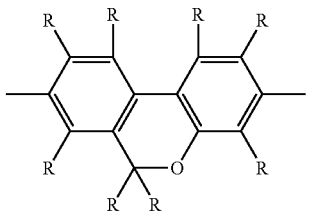
AD
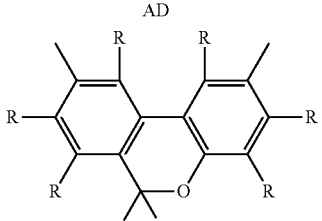
AE
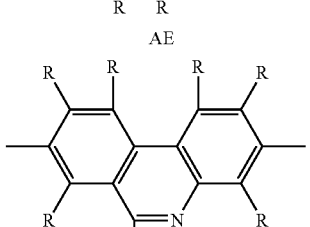
AF

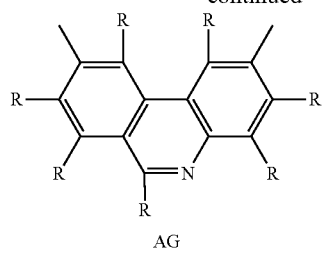
AG
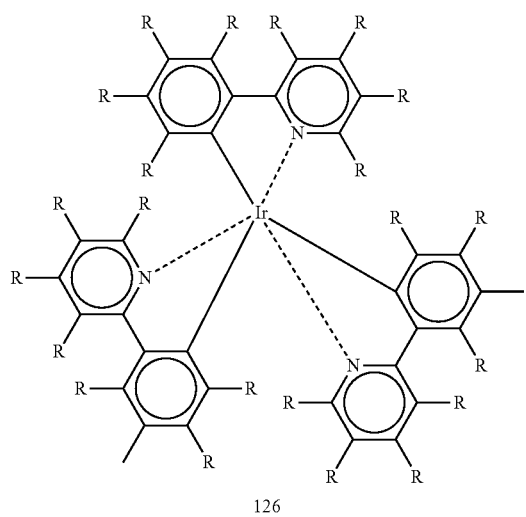
126
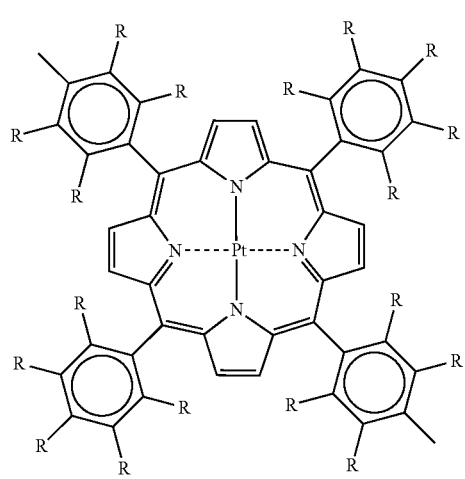
127
[Formula 20-1]
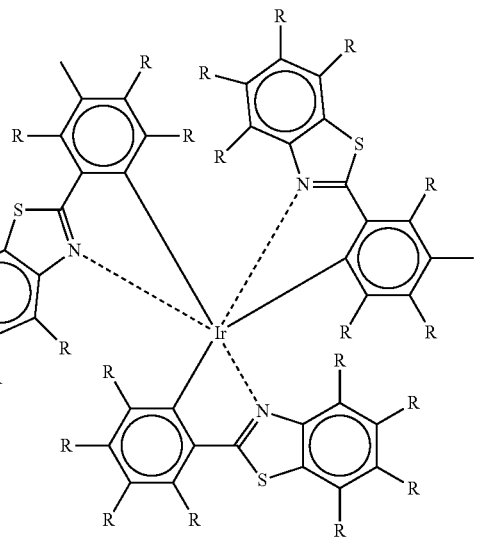
128
[Formula 20-2]
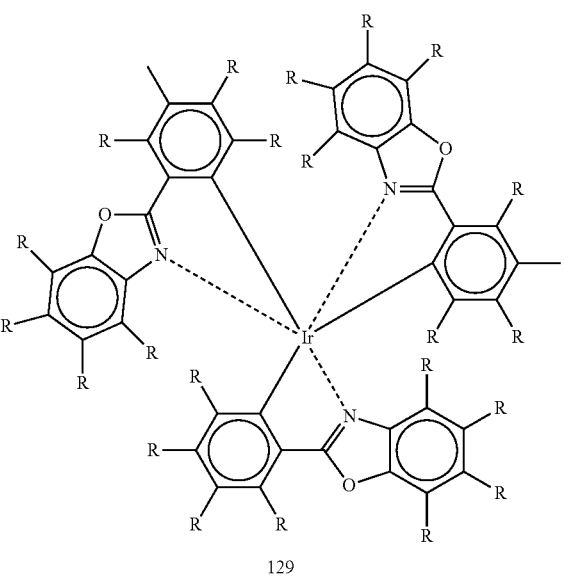
129
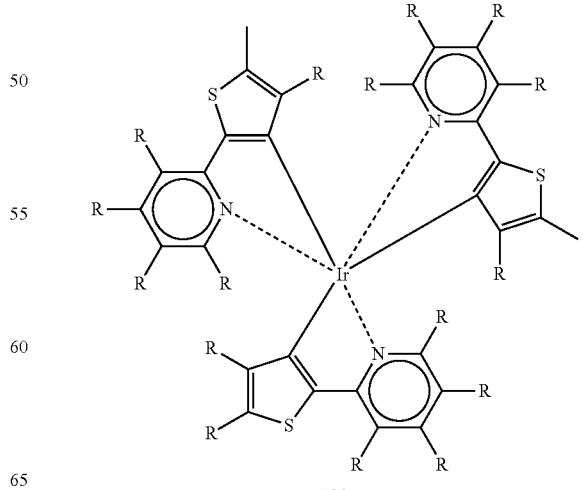
130

-continued

[Formula 20-3]

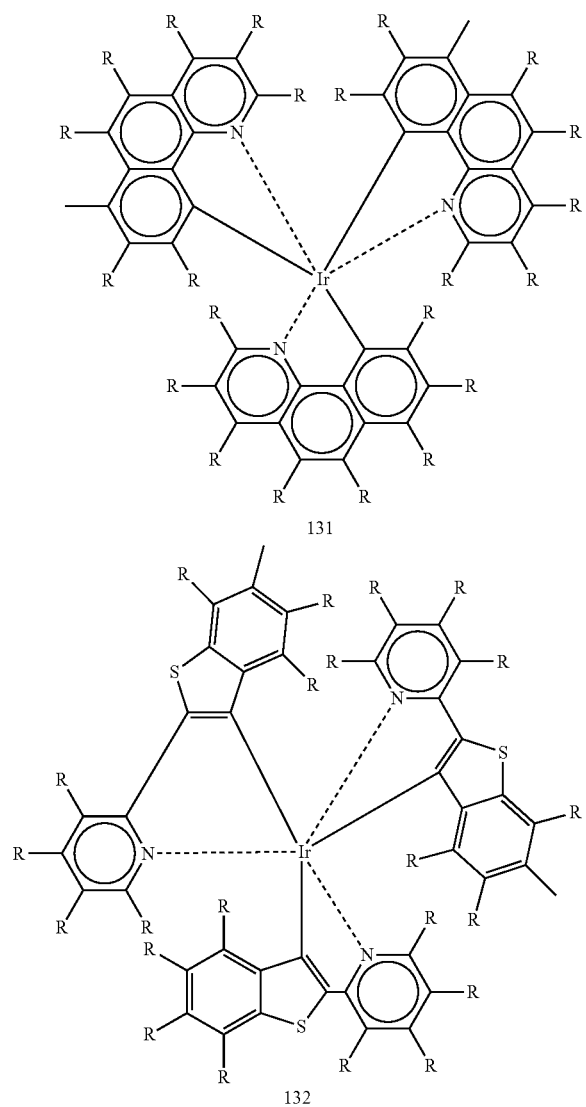

131

132

The divalent group having a metal complex structure refers to a divalent group obtained by removing two hydrogen atoms from an organic ligand of a metal complex having the organic ligand.

The number of carbon atoms of the organic ligand is generally about 4 to 60. Examples thereof include 8-quinolinol and a derivative thereof, benzoquinolinol and a derivative thereof, 2-phenyl-pyridine and a derivative thereof, 2 phenyl-benzothiazole and a derivative thereof, 2 phenyl-benzoxazole and a derivative thereof, and porphyrin and a derivative thereof.

Examples of the core metal of the complex include aluminum, zinc, beryllium, iridium, platinum, gold, europium and terbium.

Examples of the metal complex having an organic ligand include metal complexes known as a low-molecular weight fluorescent material and phosphorescent material and triplet light-emitting complexes.

Specific examples of the divalent group having a metal complex structure include those represented by the following formulas 126 to 132.

In the formulas 1 to 132, A to Z, and AA to AZ, Rs each independently represent a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, or cyano group.

The carbon atoms included in the groups of the formulas 1 to 132 may be substituted with nitrogen atoms, oxygen atoms, or sulfur atoms. The hydrogen atoms included in the groups of the formulas 1 to 132 may be substituted with fluorine atoms. Neighboring Rs in the formulas 1 to 132 may be linked to form a ring.

The alkyl group may be linear, branched or cyclic, and the number of carbon atoms is generally about 1 to 20, preferably 3 to 20. Specific examples thereof include a methyl group, ethyl group, propyl group, isopropyl group, n-butyl group, isobutyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group and perfluorooctyl group. Preferred alkyl groups are a pentyl group, isoamyl group, hexyl group, octyl group, 2-ethylhexyl group, decyl group, and 3,7-dimethyloctyl group to balance viewpoints such as solubility in organic solvents, device characteristics, and ease of synthesis, and heat resistance.

The alkoxy group may be linear, branched or cyclic and the number of carbon atoms is generally about 1 to 20, preferably 3 to 20. Specific examples thereof include a methoxy group, ethoxy group, propyloxy group, isopropyloxy group, butoxy group, isobutoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, and 2-methoxyethyloxy group. Preferred alkoxy groups are a pentyloxy group, hexyloxy group, octyloxy group, 2-ethylhexyloxy group, decyloxy group, and 3,7-dimethyloctyloxy group to balance viewpoints such as solubility in organic solvents, device characteristics, and ease of synthesis, and heat resistance.

The alkylthio group may be linear, branched or cyclic and the number of carbon atoms is generally about 1 to 20, preferably 3 to 20. Specific examples thereof include a methylthio group, ethylthio group, propylthio group, isopropylthio group, butylthio group, isobutylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and trifluoromethylthio group. Preferred alkylthio groups are a pentylthio group, hexylthio group, octylthio group, 2-ethylhexylthio group, decylthio group, and 3,7-dimethyloctylthio group to balance viewpoints such as solubility in organic solvents, device characteristics, and ease of synthesis, and heat resistance.

The aryl group is the remaining atom group obtained by removing a single hydrogen atom from an aromatic hydrocarbon and includes an aryl group having a condensed ring and an aryl group having two or more independent benzene rings or condensed rings directly joined thereto or joined via a group such as vinylene. The aryl group generally has about 6 to 60 carbon atoms, and preferably, 7 to 48 carbon atoms.

Specific examples thereof include a phenyl group, $C_1$-$C_{12}$ alkoxyphenyl group ($C_1$-$C_{12}$ represents that the number of carbon atoms is 1 to 12 and hereinafter, the same definition will be also applied), $C_1$-$C_{12}$ alkylphenyl group, 1-naphthyl group, 2-naphthyl group, 1-anthracenyl group, 2-anthracenyl group, 9-anthracenyl group and pentafluorophenyl group, and a $C_1$-$C_{12}$ alkoxyphenyl group and $C_1$-$C_{12}$ alkylphenyl group are preferable in view of solubility in organic solvents, device characteristics, and ease of synthesis, and so on. Specific examples of the $C_1$-$C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy.

Specific examples of the $C_1$-$C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group and dodecylphenyl group.

The aryloxy group generally has about 6 to 60 carbon atoms and preferably 7 to 48. Specific examples thereof include a phenoxy group, $C_1$-$C_{12}$ alkoxyphenoxy group, $C_1$-$C_{12}$ alkylphenoxy group, 1-naphthyloxy group, 2-naphthyloxy group and pentafluorophenyloxy group, and a $C_1$-$C_{12}$ alkoxyphenoxy group and $C_1$-$C_{12}$ alkylphenoxy group are preferable in view of solubility in organic solvents, device characteristics, and ease of synthesis, and so on.

Specific examples of the $C_1$-$C_{12}$ alkoxy include methoxy, ethoxy, propyloxy, isopropyloxy, butoxy, isobutoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy.

Specific examples of the $C_1$-$C_{12}$ alkylphenoxy group include a methylphenoxy group, ethylphenoxy group, dimethylphenoxy group, propylphenoxy group, 1,3,5-trimethylphenoxy group, methylethylphenoxy group, isopropylphenoxy group, butylphenoxy group, isobutylphenoxy group, t-butylphenoxy group, pentylphenoxy group, isoamylphenoxy group, hexylphenoxy group, heptylphenoxy group, octylphenoxy group, nonylphenoxy group, decylphenoxy group and dodecylphenoxy group.

The arylthio group generally has about 3 to 60 carbon atoms. Specific examples thereof include a phenylthio group, $C_1$-$C_{12}$ alkoxyphenylthio group, $C_1$-$C_{12}$ alkylphenylthio group, 1-naphthylthio group, 2-naphthylthio group, and pentafluorophenylthio group. Preferred arylthio groups are a $C_1$-$C_{12}$ alkoxyphenylthio group and $C_1$-$C_{12}$ alkylphenylthio group in view of solubility in organic solvents, device characteristics, and ease of synthesis, and so on.

The arylalkyl group generally has about 7 to 60 carbon atoms and preferably 7 to 48. Specific examples thereof include a phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphthyl-$C_1$-$C_{12}$ alkyl group and 2-naphthyl-$C_1$-$C_{12}$ alkyl group. Preferred arylalkyl groups are a $C_1$-$C_{12}$ alkoxyphenyl-$C_1$-$C_{12}$ alkyl group and $C_1$-$C_{12}$ alkylphenyl-$C_1$-$C_{12}$ alkyl group in view of solubility in organic solvents, device characteristics, and ease of synthesis, and so on.

The arylalkoxy group generally has about 7 to 60 carbon atoms and preferably 7 to 48. Specific examples thereof include a phenyl-$C_1$-$C_{12}$ alkoxy group such as a phenylmethoxy group, phenylethoxy group, phenylbutoxy group, phenylpentyloxy group, phenylhexyloxy group, phenylheptyloxy group, or phenyloctyloxy group; $C_1$-$C_{12}$ alkoxyphenyl-$C_1$-$C_{12}$ alkoxy group; $C_1$-$C_{12}$ alkylphenyl-$C_1$-$C_{12}$ alkoxy group; 1-naphthyl-$C_1$-$C_{12}$ alkoxy group; and 2-naphthyl-$C_1$-$C_{12}$ alkoxy group. Preferred arylalkoxy groups are a $C_1$-$C_{12}$ alkoxyphenyl-$C_1$-$C_{12}$ alkoxy group and $C_1$-$C_{12}$ alkylphenyl-$C_1$-$C_{12}$ alkoxy group in view of solubility in organic solvents, device characteristics, and ease of synthesis, and so on.

The arylalkylthio group generally has about 7 to 60 carbon atoms and preferably 7 to 48. Specific examples thereof include a phenyl-$C_1$-$C_{12}$ alkylthio group, $C_1$-$C_{12}$ alkoxyphenyl-$C_1$-$C_{12}$ alkylthio group, $C_1$-$C_{12}$ alkylphenyl-$C_1$-$C_{12}$ alkylthio group, 1-naphthyl-$C_1$-$C_{12}$ alkylthio group and 2-naphthyl-$C_1$-$C_{12}$ alkylthio group. Preferred arylalkylthio groups are a $C_1$-$C_{12}$ alkoxyphenyl-$C_1$-$C_{12}$ alkylthio group and $C_1$-$C_{12}$ alkylphenyl-$C_1$-$C_{12}$ alkylthio group in view of solubility in organic solvents, device characteristics, and ease of synthesis, and so on.

The arylalkenyl group generally has about 8 to 60 carbon atoms. Specific examples thereof include a phenyl-$C_2$-$C_{12}$ alkenyl group, $C_1$-$C_{12}$ alkoxyphenyl-$C_2$-$C_{12}$ alkenyl group, $C_1$-$C_{12}$ alkylphenyl-$C_2$-$C_{12}$ alkenyl group, 1-naphthyl-$C_2$-$C_{12}$ alkenyl group and 2-naphthyl-$C_2$-$C_{12}$ alkenyl group; and a $C_1$-$C_{12}$ alkoxyphenyl-$C_2$-$C_{12}$ alkenyl group and $C_2$-$C_{12}$ alkylphenyl-$C_1$-$C_{12}$ alkenyl group are preferable in view of solubility in organic solvents, device characteristics, and ease of synthesis, and so on.

The arylalkynyl group generally has about 8 to 60 carbon atoms. Specific examples thereof include a phenyl-$C_2$-$C_{12}$ alkynyl group, $C_1$-$C_{12}$ alkoxyphenyl-$C_2$-$C_{12}$ alkynyl group, $C_1$-$C_{12}$ alkylphenyl-$C_2$-$C_{12}$ alkynyl group, 1-naphthyl-$C_2$-$C_{12}$ alkynyl group and 2-naphthyl-$C_2$-$C_{12}$ alkynyl group; and a $C_1$-$C_{12}$ alkoxyphenyl-$C_2$-$C_{12}$ alkynyl group and $C_1$-$C_{12}$ alkylphenyl-$C_2$-$C_{12}$ alkynyl group are preferable in view of solubility in organic solvents, device characteristics, and ease of synthesis, and so on.

The substituted amino group may include amino groups substituted with a single group or two groups selected from the group consisting of an alkyl group, aryl group, arylalkyl group and a monovalent heterocyclic group. The alkyl group, aryl group, arylalkyl group or a monovalent heterocyclic group may have a substituent. The number of carbon atoms of the substituted amino group excluding that of the substituent is generally about 1 to 60, and preferably, 2 to 48.

Specific examples include a methylamino group, dimethylamino group, ethylamino group, diethylamino group, propylamino group, dipropylamino group, isopropylamino group, diisopropylamino group, butylamino group, isobutylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$-$C_{12}$alkoxyphenylamino group, di($C_1$-$C_{12}$alkoxyphenyl)amino group, di($C_1$-$C_{12}$alkylphenyl)amino group, 1-naphthylamino group, 2-naphthylamino group, pentafluorophenylamino group, pyridylamino group, pyridazinylamino group, pyrimidylamino group, pyrazylamino group, triazylamino group phenyl-$C_1$-$C_{12}$alkylamino group, $C_1$-$C_{12}$alkoxyphenyl-$C_1$-$C_{12}$alkylamino group, $C_1$-$C_{12}$alkylphenyl-$C_1$-$C_{12}$alkylamino group, di($C_1$-$C_{12}$alkoxyphenyl-$C_1$-$C_{12}$alkyl) amino group, di($C_1$-$C_{12}$alkylphenyl-$C_1$-$C_{12}$alkyl) amino group, 1-naphthyl-$C_1$-$C_{12}$alkylamino group and 2-naphthyl-$C_1$-$C_{12}$alkylamino group.

The substituted silyl group may include silyl groups substituted with 1, 2 or 3 groups selected from the group consisting of an alkyl group, aryl group, arylalkyl group and a monovalent heterocyclic group. The substituted silyl group generally has about 1 to 60 carbon atoms, and preferably 3 to 48 carbon atoms. Note that the alkyl group, aryl group, arylalkyl group and a monovalent heterocyclic group may have a substituent.

Specific examples thereof include a trimethylsilyl group, triethylsilyl group, tripropylsilyl group, triisopropylsilyl group, dimethyl-isopropylsilyl group, diethyl-isopropylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$-$C_{12}$alkylsilyl group, $C_1$-$C_{12}$alkoxyphenyl-$C_1$-$C_{12}$alkylsilyl group, $C_1$-$C_{12}$alkylphenyl-$C_1$-$C_{12}$alkylsilyl group, 1-naphthyl-$C_1$-$C_{12}$alkylsilyl group, 2-naphthyl-$C_1$-$C_{12}$alkylsilyl group, phenyl-$C_1$-$C_{12}$alkyldimethylsilyl group, triphenylsilyl group, tri-p-xylylsilyl group, tribenzylsilyl group, diphenylmethylsilyl group, t-butyldiphenylsilyl group and dimethylphenylsilyl group.

Examples of the halogen atom include a fluorine atom, chlorine atom, bromine atom and iodine atom.

The acyl group generally has about 2 to 20 carbon atoms, and preferably, 2 to 18 carbon atoms. Specific examples thereof include an acetyl group, propionyl group, butyryl group, isobutyryl group, pivaloyl group, benzoyl group, trifluoroacetyl group and pentafluorobenzoyl group.

The acyloxy group generally has about 2 to 20 carbon atoms, and preferably, 2 to 18 carbon atoms. Specific examples thereof include an acetoxy group, propionyloxy group, butyryloxy group, isobutyryloxy group, pivaloyloxy group, benzoyloxy group, trifluoroacetyloxy group and pentafluorobenzoyloxy group.

The imine residue refers to a residue obtained by removing a single hydrogen atom from an imine compound. The imine compound is an organic compound including —N═C— intramolecularly. Examples of the imine compound may include aldimine, ketimine, and compounds in which the hydrogen atom on the N atom of aldimine or ketimine is substituted with an alkyl group or the like. The imine residue generally has about 2 to 20 carbon atoms, and preferably 2 to 18 carbon atoms. Specific examples thereof include groups represented by the following structural formulas.

[Formula 21]

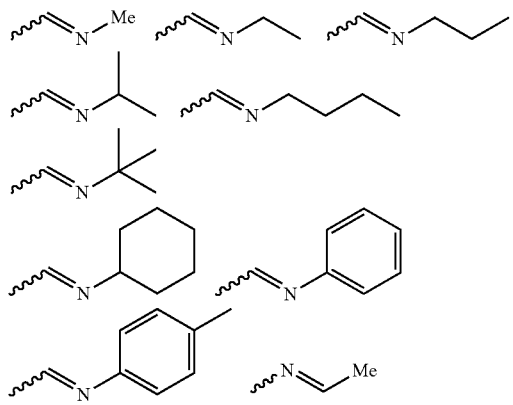

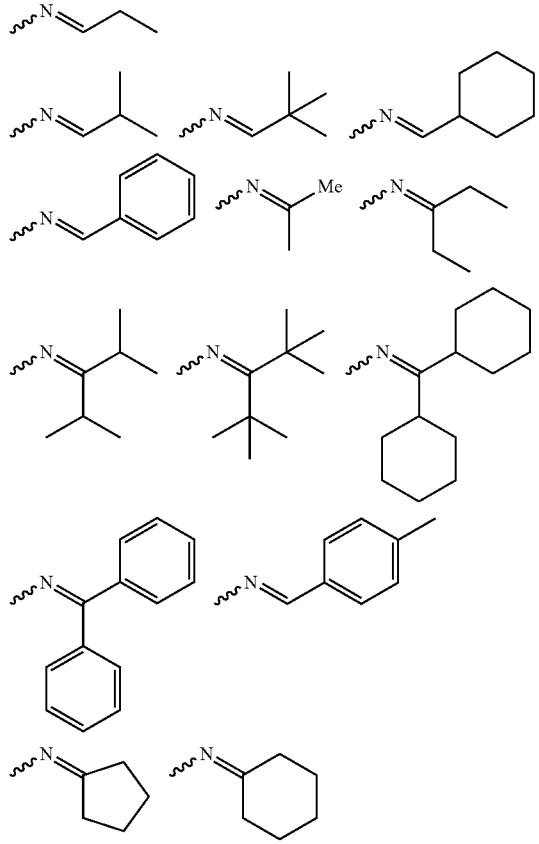

The amide group has about 2 to 20 carbon atoms, and preferably, 2 to 18 carbon atoms. Specific examples thereof include a formamide group, acetamido group, propioamide group, butyroamide group, benzamido group, trifluoroacetamido group, pentafluorobenzamide group, diformamide group, diacetamide group, dipropyoamide group, dibutyroamide group, dibenzamide group, ditrifluoroacetamide group and dipentafluorobenzamide group.

The acid imido group may be a residue obtained by removing a hydrogen atom bound to the nitrogen atom of the acid imido and has about 4 to 20 carbon atoms. Specific examples thereof include groups represented below.

[Formula 22]

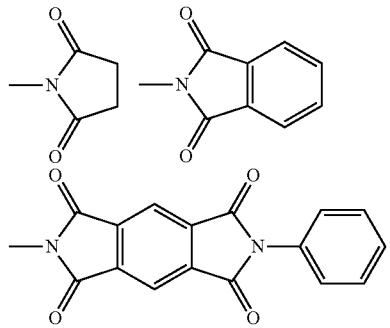

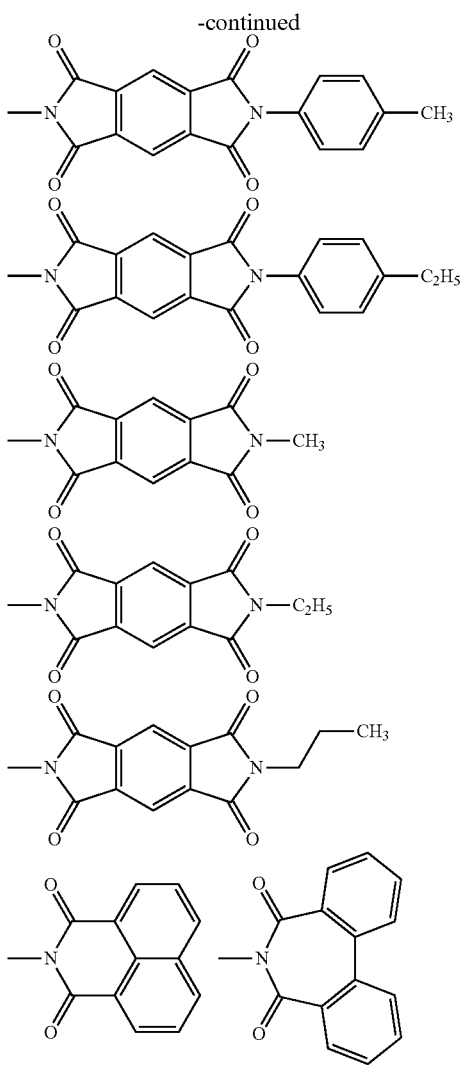

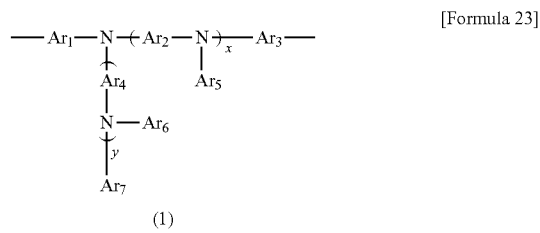

The monovalent heterocyclic group refers to an atom group obtained by removing a single hydrogen atom from a heterocyclic compound and generally has about 4 to 60 carbon atoms, and preferably, 4 to 20 carbon atoms. Note that the number of carbon atoms of the heterocyclic group does not include the number of carbon atoms of a substituent. The heterocyclic compound herein refers to an organic compound having a ring structure which may not be necessarily constituted of carbon atoms alone and may include a hetero atom such as oxygen, sulfur, nitrogen, phosphorus, boron, or silicon. Specific examples of the monovalent heterocyclic group include a thienyl group, $C_1$-$C_{12}$ alkylthienyl group, pyrrolyl group, furyl group, pyridyl group, $C_1$-$C_{12}$ alkylpyridyl group, piperidyl group, quinolyl group and isoquinolyl group; and a thienyl group, $C_1$-$C_{12}$ alkylthienyl group, pyridyl group and $C_1$-$C_{12}$ alkylpyridyl group are preferable.

The substituted carboxyl group may include a carboxyl group substituted with an alkyl group, aryl group, arylalkyl group or monovalent heterocyclic group and generally has about 2 to 60 carbon atoms, and preferably, 2 to 48 carbon atoms. Specific examples thereof include a methoxycarbonyl group, ethoxycarbonyl group, propoxycarbonyl group, isopropoxycarbonyl group, butoxycarbonyl group, isobutoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group and pyridyloxycarbonyl group. Note that the alkyl group, aryl group, arylalkyl group or monovalent heterocyclic group may have a substituent. Note that the number of carbon atoms of the substituted carboxyl group does not include the number of carbon atoms of the substituent.

The divalent aromatic amine group refers to an atom group obtained by removing two hydrogen atoms from an aromatic amine compound. The group may have a substituent. A specific structure of the divalent aromatic amine group is represented by the structure of the following formula (1).

[Formula 23]

$$-Ar_1-N-(Ar_2-N)_x-Ar_3-$$
$$\quad\quad |\quad\quad\quad\quad |$$
$$\quad\quad Ar_4\quad\quad\quad Ar_5$$
$$\quad\quad\quad\quad\quad N-Ar_6$$
$$\quad\quad\quad\quad\quad |_y$$
$$\quad\quad\quad\quad\quad Ar_7$$

(1)

In the formula, $Ar_1$, $Ar_2$, $Ar_3$ and $Ar_4$ each independently represent an arylene group or a divalent heterocyclic group; $Ar_5$, $Ar_6$ and $Ar_7$ each independently represent an aryl group or a monovalent heterocyclic group; $Ar_1$, $Ar_2$, $Ar_3$, $Ar_4$, $Ar_5$, $Ar_6$, and $Ar_7$ may have a substituent; and x and y each independently represent 0 or a positive integer. The type of the substituent is not particularly limited. In view of solubility, fluorescent properties, ease of synthesis and characteristics of the resultant device, preferable examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, and cyano group.

Examples of the divalent aromatic amine group include groups represented by the following formulas 133 to 140.

[Formula 24]

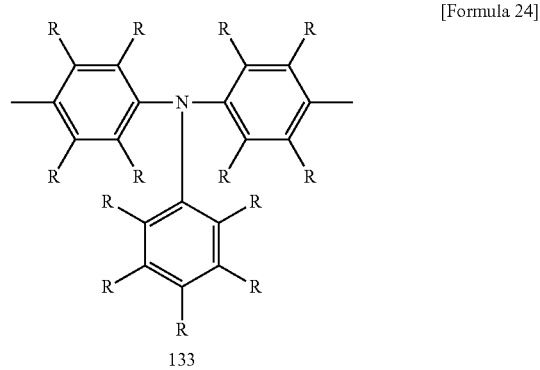

133

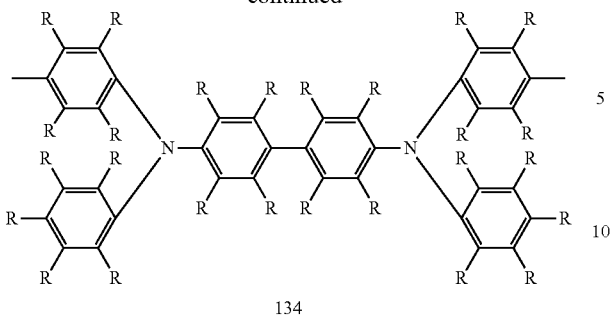
134

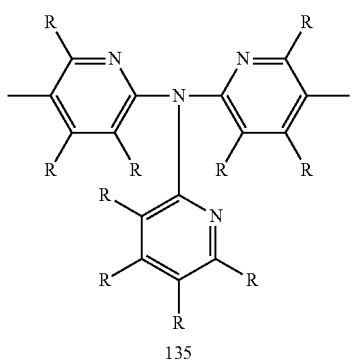
135

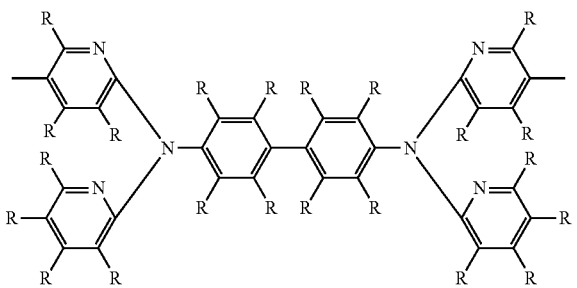
136

[Formula 25]

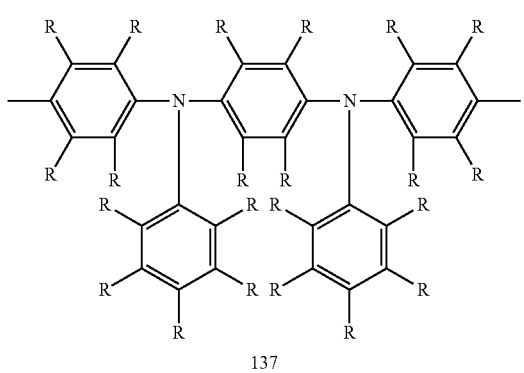
137

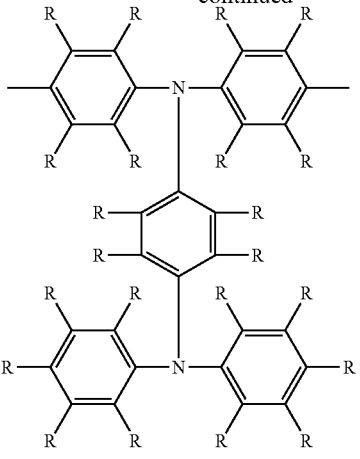
138

[Formula 26]

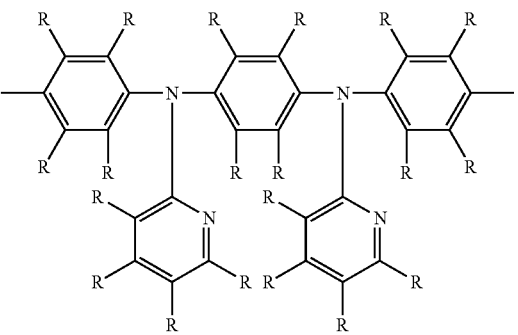
139

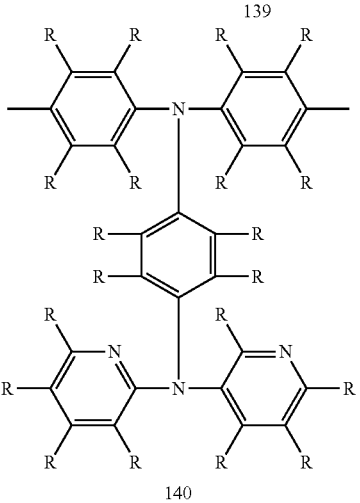
140

The Rs of the above formulas are the same as defined in the formulas 1 to 132.

To increase solubility of a polymer compound in an organic solvent, the polymer compound preferably includes one or more atoms other than a hydrogen atom, and symmetricalness in shape of a repeat unit including a substituent is preferably low.

In the aforementioned formulas, when R is a substituent including alkyl, in order to increase solubility of a polymer compound in an organic solvent, one or more cyclic or branched alkyls are preferably contained. Furthermore, in the aforementioned formulas, when R partly contains an aryl group or a heterocyclic group, these groups may have one or more substituents. Among the structures represented by the formulas 133 to 140, the structures represented by the formulas 134 and 137 are preferable in view of adjusting light emission wavelength.

The repeat unit represented by the above formula (1) preferably includes $Ar_1$, $Ar_2$, $Ar_3$ and $Ar_4$ each independently representing an arylene group, and $Ar_5$, $Ar_6$ and $Ar_7$ each independently representing an aryl group in view of adjusting light emission wavelength, device characteristics, and so on.

It is preferred that $Ar_1$, $Ar_2$, and $Ar_3$ each independently represent an unsubstituted phenylene group, unsubstituted biphenyl group, unsubstituted naphthylene group, or unsubstituted anthracene-diyl group.

In view of solubility in organic solvents, device characteristics, and so on, it is preferred that $Ar_5$, $Ar_6$ and $Ar_7$ each independently represent an aryl group including three or more substituents. More preferably, $Ar_5$, $Ar_6$ and $Ar_7$ represent a phenyl group including three or more substituents; a naphthyl group including three or more substituents; or an anthranyl group including three or more substituents. Still more preferably, $Ar_5$, $Ar_6$ and $Ar_7$ represent a phenyl group including three or more substituents.

Of them, it is preferable that $Ar_5$, $Ar_6$ and $Ar_7$ each independently represent the following formula (9) and satisfy the relationship: $x+y \leq 3$, more preferably $x+y=1$, and still more preferably $x=1$ and $y=0$.

[Formula 27]

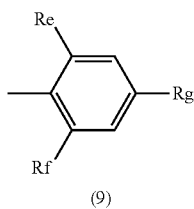

(9)

In the formula, Re, Rf and Rg each independently represent an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group, or halogen atom. Hydrogen atoms included in Re, Rf and Rg may be optionally substituted with fluorine atoms.

More preferably, in the formula (9), Re and Rf each independently represent an alkyl group having 3 or less carbon atoms, alkoxy group having 3 or less carbon atoms or alkylthio group having 3 or less carbon atoms; and Rg is an alkyl group having 3 to 20 carbon atoms, alkoxy group having 3 to 20 carbon atoms, or alkylthio group having 3 to 20 carbon atoms.

In the repeat unit represented by the formula (9), $Ar_2$ preferably represent a group represented by the following formula (9-1) or (9-2).

[Formula 28]

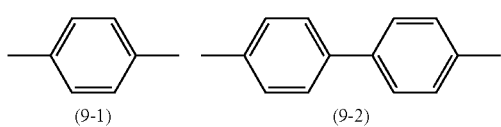

(9-1)   (9-2)

In the formulas, the benzene ring(s) included in the structures represented by (9-1) or (9-2) may each independently include a single or more and four or less substituents; The substituents may be the same or different; A plurality of the substituents may be linked to form a ring; and the benzene ring(s) may be linked to another aromatic hydrocarbon ring or a heterocyclic ring.

Among the repeat units represented by the formula (1), specific examples particularly preferred are represented by the following formulas 141 and 142.

[Formula 29]

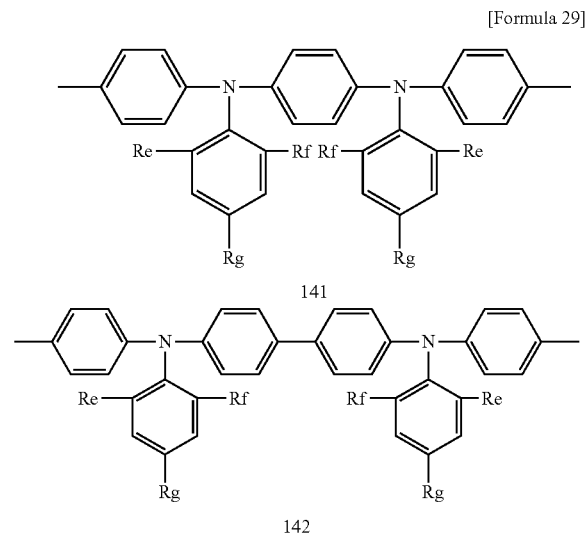

141

142

Preferred polymers for forming light-emitting layers of polymer LEDs include any one of repeat units represented by the formula (1) and the following formulas (2) to (8) in view of device characteristics, ease of synthesis, fluorescence intensity, and so on.

[Formula 30]

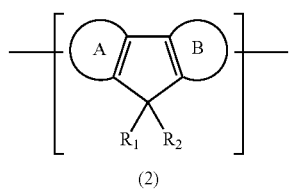

(2)

In the formula, ring A and ring B each independently represent an aromatic hydrocarbon ring that may have a substituent; two bonds are respectively present on the ring A and/or the ring B; and $R_1$ and $R_2$ each independently represent a substituent.

[Formula 31]

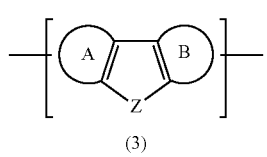

(3)

In the formula, ring A and ring B represent the same as those mentioned above; two bonds are respectively present on the ring A and/or the ring B; Z represents —O—, —S—, —S(=O)—, —S(=O)(=O)—, —N(R$_3$)—, —Si(R$_3$)(R$_4$)—, —P(=O)(R$_3$)—, —P(R$_3$)—, —B(R$_3$)—, —C(R$_3$)(R$_4$)—O—, —C(R$_3$)=N— or —Se—; and R$_3$ and R$_4$ each independently represent a substituent.

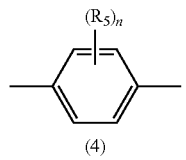

(4)

[Formula 32]

In the formula, R$_5$ represents a substituent; n represents an integer of 0 to 4; and when a plurality of R$_5$ are present, they may be the same or different.

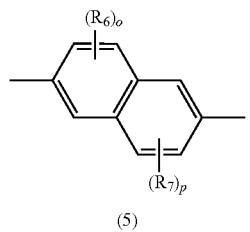

(5)

[Formula 33]

In the formula, R$_6$ and R$_7$ represent a substituent; o and p each independently represent an integer of 0 to 3; and when a plurality of R$_6$ and R$_7$ are present, they may be the same or different.

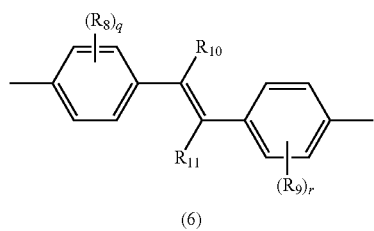

(6)

[Formula 34]

In the formula, R$_8$, R$_9$, R$_{10}$, and R$_{11}$ represent a substituent; q and r each independently represent an integer of 0 to 4; and when a plurality of R$_8$ and R$_9$ are present, they may be the same or different.

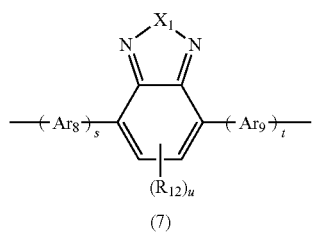

(7)

[Formula 35]

In the formula, R$_{12}$ represents a substituent; u represents an integer of 0 to 2; Ar$_8$ and Ar$_9$ each independently represent an arylene group, divalent heterocyclic group, or divalent group including a metal complex structure; s and t each independently represent 0 or 1; X$_1$ represents —O—, —S—, —S(=O)—, —SO$_2$—, —Se—, or —Te—; and when a plurality of R$_{12}$ are present, they may be the same or different.

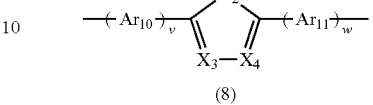

(8)

[Formula 36]

In the formula, Ar$_{10}$ and Ar$_{11}$ each independently represent an arylene group, divalent heterocyclic group, or divalent group including a metal complex structure; v and w each independently represent 0 or 1; X$_2$ represents —O—, —S—, —S(=O)—, —S(=O)(=O)—, —Se—, —Te—, —NR$_{14}$—, or —SiR$_{15}$R$_{16}$—.

Specific structures of the formula (2) may include structures represented by the following formulas 2-1 to 2-17.

[Formula 37]

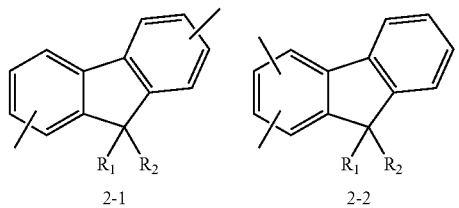

2-1    2-2

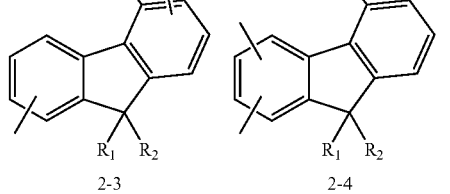

2-3    2-4

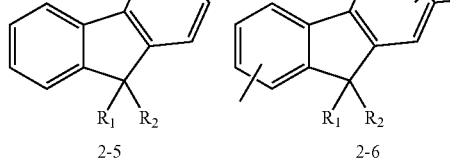

2-5    2-6

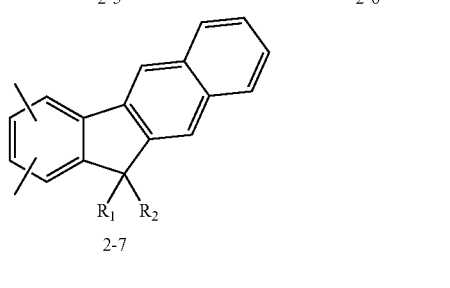

2-7

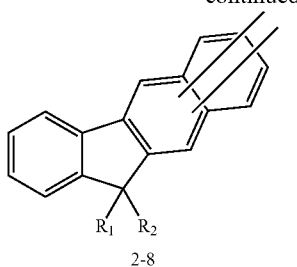
2-8

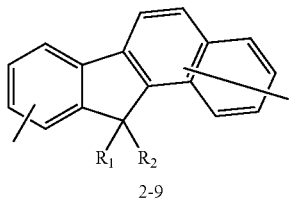
2-9

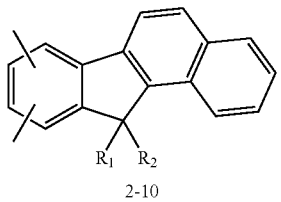
2-10

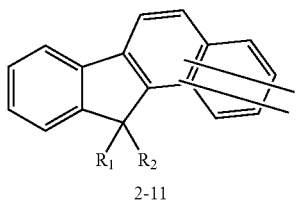
2-11

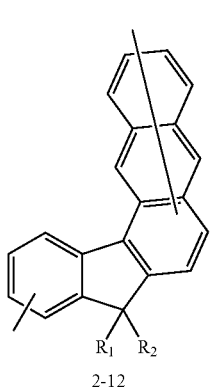
2-12

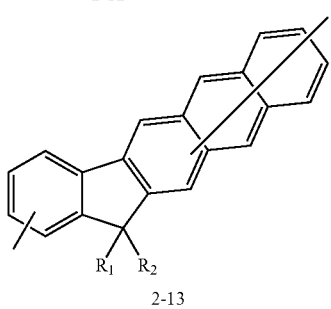
2-13

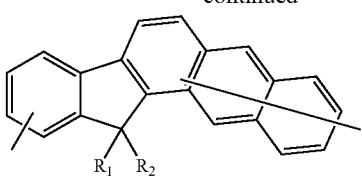
2-14

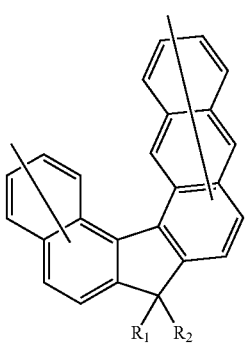
2-15

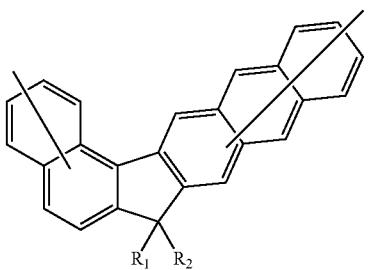
2-16

[Formula 38]

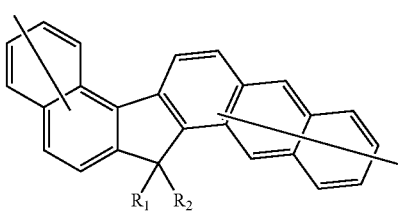
2-17

In the formulas, $R_1$ and $R_2$ represent a substituent, and preferably a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, or cyano group in view of solubility and ease of synthesis. Examples of these groups are the same as those mentioned above. Among these substituents, preferred are an alkyl group, alkoxy group, aryl group, and aryloxy group. $R_1$ and $R_2$ may be linked to each other to form a ring.

Examples of the formula (3) may include structures represented by the following formulas 3-1 to 3-12.

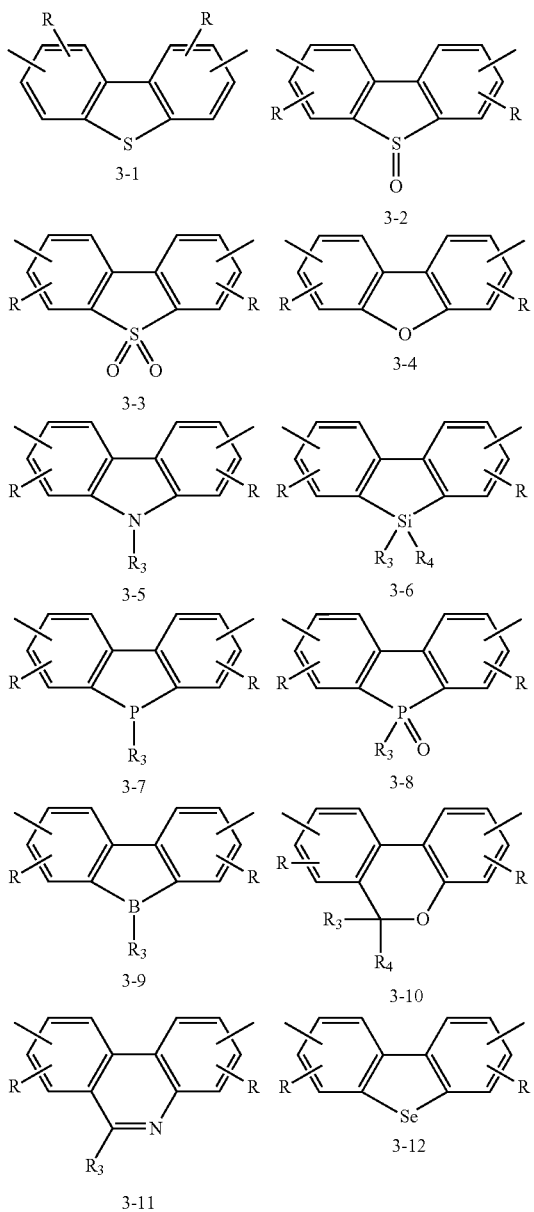

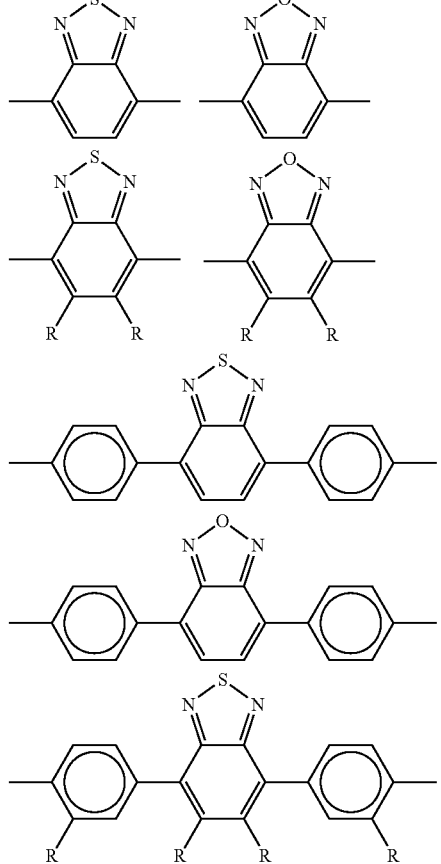

Examples of the Rs in the formulas are the same as the Rs mentioned above, and preferred Rs are an alkyl group, alkoxy group, aryl group, and aryloxy group. A plurality of hydrogen atoms in the formulas may be substituted with the substituents R. $R_3$ and $R_4$ represent a substituent, and preferably a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, or cyano group in view of solubility, ease of synthesis, and so on. Examples of these groups are the same as those mentioned above. Among these substituents, preferred are an alkyl group, alkoxy group, aryl group, and aryloxy group. In view of solubility, the structures preferably include one to three alkyl groups, alkoxy groups, aryl groups, or aryloxy groups.

Examples of $R_5$, $R_6$, $R_7$, $R_8$, $R_9$, $R_{12}$, $R_{13}$, $R_{14}$, $R_{15}$, and $R_{16}$ in the formulas (4) to (8) include a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, and cyano group. Examples of these groups are the same as those mentioned above. Among these substituents, preferred are an alkyl group, alkoxy group, aryl group, and aryloxy group. Examples of $R_{10}$ and $R_{11}$ in the formula (6) include a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, and cyano group. Examples of these groups are the same as those mentioned above. Among these substituents, preferred are a hydrogen atom, an alkyl group, and aryl group.

Examples of the formula (7) may include the following structures.

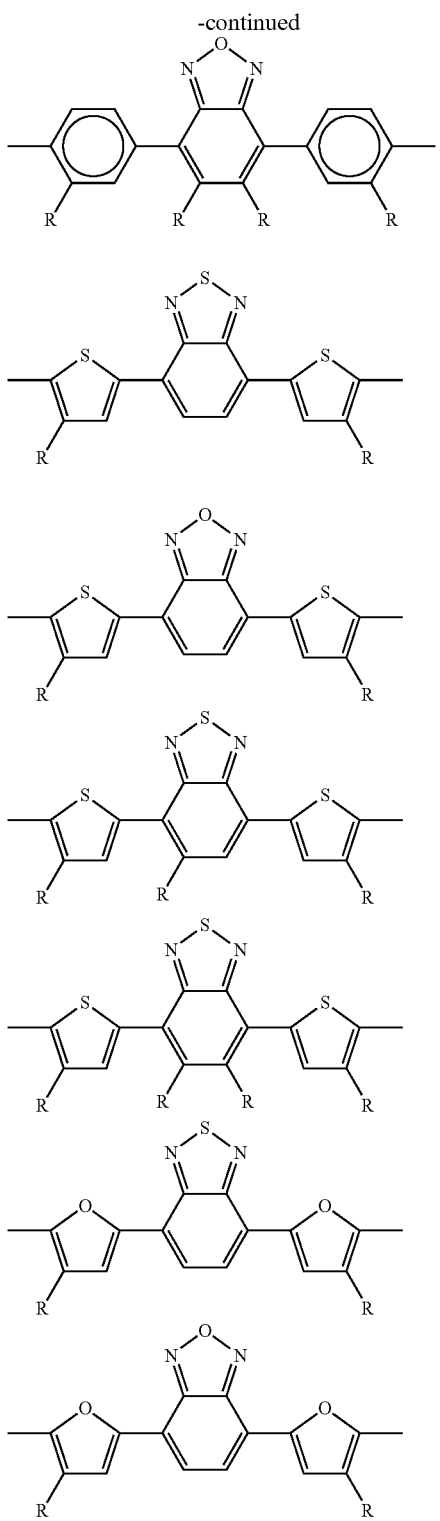

Examples of the Rs in the formulas are the same as the Rs mentioned above, and preferred Rs are an alkyl group, alkoxy group, aryl group, and aryloxy group.

Preferred examples of the formula (8) include the following structures.

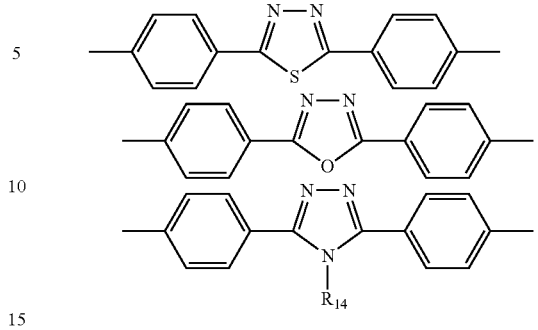

Examples of the Rs in the formulas are the same as the Rs mentioned above, and preferred Rs are an alkyl group, alkoxy group, aryl group, and aryloxy group.

When the hole transport layer of a polymer LED is formed by using a composition according to the present invention, preferred polymers contained in the composition include polyvinylcarbazole or a derivative thereof; polysilane or a derivative thereof; polysiloxane derivative having an aromatic amine in a side chain or the main chain; pyrazoline derivative; arylamine derivative; stilbene derivative; triphenyl-diamine derivative; polyaniline or a derivative thereof; polythiophene or a derivative thereof; polypyrrole or a derivative thereof; poly(p-phenylenevinylene) or a derivative thereof; poly(2,5-thienylenevinylene) or a derivative thereof; and the polymers mentioned as examples used for forming a light-emitting layer.

When the electron transport layer of a polymer LED is formed by using a composition according to the present invention, preferred polymers contained in the composition include polyquinoline, polyquinoxaline, and other polymers mentioned as examples used for forming a light-emitting layer.

Polymers contained in a composition according to the present invention can be produced by effecting reaction among monomers represented by general formulas (10) and (11), and general formulas (12) and/or (13).

In the formulas, $Ar_{12}$ and $Ar_{13}$ each independently represent an arylene group, divalent heterocyclic group, divalent group including a metal complex structure, or a divalent aromatic amine group; $L_1$ and $L_2$ independently represent an end group; $K_1$, $K_2$, $K_3$, $K_4$, $K_5$, and $K_6$ each independently represent a leaving group; and note that $L_1$ and $L_2$ are different from each other.

Examples of the leaving group may include a halogen atom, an alkylsulfonyloxy group, arylsulfonyloxy group, and —$B(OR_{17})_2$ where $R_{11}$ represents a hydrogen atom or an alkyl group.

Examples of the halogen atom may include a chlorine atom, bromine atom and iodine atom; preferably a chlorine atom and bromine atom; and the most preferably a bromine atom. The alkylsulfonyloxy group may be optionally substituted with a fluorine atom, and examples of the group may include a trifluoromethanesulfonyloxy group. The arylsulfonyloxy group may be optionally substituted with an alkyl group, and examples of the group may include a phenylsulfonyloxy group and trisulfonyloxy group.

In the group represented by $—B(OR_{17})_2$, $R_{17}$ represents a hydrogen atom or an alkyl group. The alkyl group generally has about 1 to 20 carbon atoms. Examples of the alkyl group may include a methyl group, ethyl group, propyl group, butyl group, hexyl group, octyl group, and dodecyl group. The alkyl groups may be linked to each other to form a ring.

Specific examples of the group represented by $—B(OR_{17})_2$ are shown below.

[Formula 42]

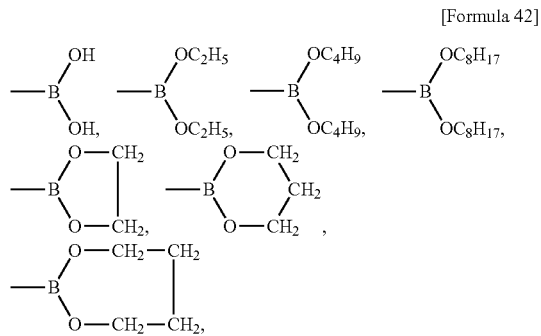

Of them, preferred examples are shown below.

[Formula 43]

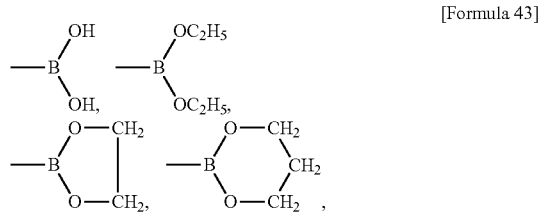

The total of charged amounts of the monomers of the general formulas (12) and (13) to that of the monomers of the general formulas (10) and (11) is generally 0.1 to 10 mole %, preferably 0.2 to 5 mole %, and more preferably 0.5 to 3 mole %.

Examples of a method for producing the polymers according to the present invention may include: a method of polymerizing appropriate monomers mentioned above by Suzuki reaction (Chem. Rev., vol. 95, p. 2457 (1995)); a polymerization method by Grignard reaction (Polymer Functional Material Series vol. 2, Synthesis and Reaction of Polymers (2), p. 432-3, published by Kyoritsu Shuppan Co., Ltd.); a polymerization method by Yamamoto polymerization method (Prog. Polym. Sci., vol. 17, p. 1153-1205, 1992); a polymerization method using an oxidization agent such as $FeCl_3$; and an electrochemical oxidization polymerization method (The Fourth Series of Experimental Chemistry, vol. 28, p. 339-340, published by Maruzen Co., Ltd.).

Herein, a case of employing the Suzuki reaction is described. In this case, for example, such monomers are used in which $K_1$ and $K_2$ each independently represent $—B(OR_{17})_2$ where $R_{11}$ represents a hydrogen atom or an alkyl group; $K_3$ and $K_4$ each independently represent a halogen atom, an alkylsulfonyloxy group, or arylsulfonyloxy group; $K_5$ represents $—B(OR_{17})_2$ where $R_{17}$ represents a hydrogen atom or an alkyl group; and $K_6$ represents a halogen atom, an alkylsulfonyloxy group, or arylsulfonyloxy group. A reaction among these monomers are effected in the presence of a Pd(0) catalyst to produce the polymers.

In the above case, in a reaction in which at least one type of the two or more types of monomers including two leaving groups to be used in the reaction is a monomer including two $—B(OR_{17})_2$ where $R_{17}$ represents a hydrogen atom or an alkyl group; and at least one type of the two or more types of monomers is a monomer including two halogen atoms, alkylsulfonyloxy groups, or arylsulfonyloxy groups, reaction procedures are generally conducted by effecting reaction among monomers represented by the formulas (10) and (11) for about 1 to 100 hours, adding the monomer (12) to the system and effecting reaction for about 0.5 to 50 hours, then adding the monomer (13) to the system and effecting reaction for about 0.5 to 50 hours.

As the Pd(0) catalyst, for example, palladium[tetrakis(triphenylphosphine)], palladium acetates, or the like is used. One or more equivalents, preferably 1 to 10 equivalents, of an inorganic base such as potassium carbonate, sodium carbonate, or barium hydroxide; an organic base such as triethylamine; and an inorganic salt such as cesium fluoride are added to the monomers to effect reaction. The reaction may be effected by using an aqueous solution of the inorganic salt in two-phase system. Examples of a solvent may include N,N-dimethylformamide, toluene, dimethoxy-ethane, or tetrahydrofuran. Depending on the solvent, reaction temperature is preferably about 50 to 160° C. The system may be heated to about the boiling point of the solvent, and then refluxed. Reaction time is about 1 to 200 hours.

A case of employing the Yamamoto polymerization method is described. In this case, for example, such monomers are used in which $K_1$, $K_2$, $K_3$, $K_4$, $K_5$ and $K_6$ each independently represent a halogen atom, an alkylsulfonyloxy group, or arylsulfonyloxy group. A reaction among these monomers are effected in the presence of a Ni(0) complex to produce the polymers. In general, the reaction is effected by mixing all the monomers (10) to (13).

As a method of using the Ni(0) complex (zerovalent nickel complex), there is a method of using zerovalent nickel itself and a method of effecting reaction of a nickel salt in the presence of a reducing agent to produce zerovalent nickel and using the zerovalent nickel in a reaction. Examples of the zerovalent nickel complex may include bis(1,5-cyclooctadiene)nickel(0), (ethylene)bis(triphenylphosphine)nickel(0), and tetrakis(triphenylphosphine)nickel. Among these, bis(1, 5-cyclooctadiene)nickel(0) is preferable in view of being suitable for a wide variety of uses and inexpensive. Addition of a neutral ligand is preferable in view of increasing yield. The neutral ligand refers to a ligand without having an anion or a cation. Examples of the neutral ligand may include a nitrogen-containing ligand such as 2,2'-bipyridyl, 1,10-phenanthroline, methylenebisoxazoline, or N,N'-tetramethylethylenediamine; and a tertiary phosphine ligand such as triphenylphosphine, tritolylphosphine, tributylphosphine, or triphenoxyphosphine. The nitrogen-containing ligand is preferable in view of being suitable for a wide variety of uses and inexpensive, and 2,2'-bipyridyl is particularly preferable in view of high reactivity and high yield. In particular, a system containing bis(1,5-cyclooctadiene)nickel(0) to which 2,2'-bipyridyl is added as a neutral ligand is preferable in view of increasing the yield of the polymers. In the method of using a zerovalent nickel in a reaction in a system, examples of the nickel salt may include nickel chloride or nickel acetate. Examples of the reducing agent may include zinc, sodium hydroxide, hydrazine and its derivatives, and lithium aluminum hydride. An additive such as ammonium iodide, lithium iodide, or potassium iodide may be used as necessary. A polymerization solvent is not particularly restricted as long as the solvent does not inhibit polymerization, but the solvent preferably contains one or more types of aromatic hydrocarbon solvents and/or ether solvents. Herein, examples of the aromatic hydrocarbon solvents may include benzene, toluene, xylene, trimethylbenzene, tetramethylbenzene, butylbenzene, naphthalin, and tetralin; and toluene, xylene, tetralin, and tetramethylbenzene are preferable. Examples of the ether solvent may include diisopropyl ether, tetrahydrofuran, 1,4-dioxane, diphenyl ether, ethylene glycol dimethyl ether, and tert-butylmethylether; and tetrahydrofuran and 1,4-dioxane, which are good solvents for polymers, are preferable. Among the solvents, tetrahydrofuran is the most preferable. In view of improving polymerizability and solubility, a mixed solvent of the aromatic hydrocarbon solvents and/or ether solvents and a solvent other than aromatic hydrocarbon solvents and ether solvents may be used as long as the mixed solvent does not inhibit polymerization reaction.

Reaction procedures and so on can be conducted, for example, according to a method shown in JP-A-2000-44544. In the Yamamoto polymerization method, for example, a polymerization reaction is generally conducted under an inert gas atmosphere such as argon or nitrogen in a solvent of tetrahydrofuran at a temperature of 60° C. in the presence of a zerovalent nickel complex and a neutral ligand. Polymerization time is generally about 0.5 to 100 hours, but 10 hours or less is preferable in view of production cost. Polymerization temperature is generally about 0 to 200° C., but 20 to 100° C. is preferable in view of high yield and low cost for heating.

In the case of using a neutral ligand, the amounts of the neutral ligand to be used is preferably about 0.5 to 10 moles per 1 mole of a zerovalent nickel complex in view of reaction yield and cost, more preferably about 0.8 to 1.5 moles, and more preferably 0.9 to 1.1 moles.

The amounts of the zerovalent nickel complex to be used are not particularly restricted as long as the complex does not inhibit polymerization reaction. However, when the amounts of the complex are too small, the resulting polymer tends to have low molecular weight. When the amounts of the complex are too large, post handling tends to be burdensome. The amounts of the complex is preferably 0.1 to 10 moles to 1 mole of a monomer, more preferably 1 to 5 moles, and still more preferably 2 to 3.5 moles.

When a polymer is used as a light-emitting material for polymer LEDs, monomers before being polymerized are preferably purified by methods such as distillation, sublimation purification, or recrystallization, and then the monomers are polymerized. After the polymer is synthesized, a purification treatment such as fractionation like reprecipitation purification or chromatography may be conducted.

The polymer contained in a composition according to the present invention may be one type, or two or more types. When the composition contains two or more types of polymers, the composition may contain a polymer that does not transport charges or a polymer that does not emit light.

As for storage stability of a composition according to the present invention, it is preferred that viscosity change after a lapse of 30 days since preparation of the composition is within ±5% of the viscosity on preparation, and more preferably viscosity change after a lapse of 90 days since preparation of the composition is within ±5% of the viscosity on preparation.

Examples of the method of forming a thin film with a composition according to the present invention include film forming methods such as spin-coating method, casting method, microgravure coating method, gravure-coating method, bar-coating method, roll-coating method, wire-bar coating method, dip-coating method, spray-coating method, screen printing method, flexographic printing method, offset printing method, and inkjet method. Among the methods, the composition according to the present invention is particularly suitable for forming films with the inkjet method.

The inkjet method is conducted by dissolving a polymer in a solvent and dispensing the polymer with inkjet equipment or the like. The solution may contain an additive or a dopant on preparation of the solution. The inkjet method is advantageous in that different colors can be applied separately and materials can be utilized efficiently with small loss of the materials.

The optimal value of thin film thickness differs depending upon a material to be used and uses. The film thickness is, for example, 1 nm to 1 µm, preferably 2 nm to 500 nm, and further preferably, 5 nm to 200 nm.

A composition according to the present invention is characterized in that a thin film with uniform thickness is formed with the composition. A thin film with uniform thickness causes less light-emission irregularity when the film is used as the light-emitting layer of a polymer LED, and a device with such a polymer LED has a longer luminance half life period. Herein, a uniform film preferably refers to a film having a planar profile particularly in the central portion of the film. A film with slightly convex or concave profile does not cause problems because light-emission irregularity is small. However, a thin film with a greatly concave profile causes considerable light-emission irregularity, and a device with such a film has a shorter luminance half life period. There are various methods for measuring profiles of thin films. For example, there is a method of charging a liquefied composition into a syringe, dispensing the composition on a glass substrate with the syringe to which a high precision needle is attached, drying the composition, and then measuring the profile of the dried thin film with an interference microscope. The thin film may be dried at room temperature or at an elevated temperature, under a normal pressure or a reduced pressure.

The profile of a thin film can be evaluated visually by looking at the profile, but can also be evaluated based on the film thickness of the central portion of the film and the film thickness of the thickest portion of the film. That is, in view of reducing light-emission irregularity, a value obtained by dividing the film thickness of the thickest portion by the film thickness of the central portion of a film is preferably equal to or less than 1.50, more preferably equal to or less than 1.35, still more preferably equal to or less than 1.20, yet more preferably equal to or less than 1.10, and still yet more preferably equal to or less than 1.05.

A polymer LED according to the present invention comprises a light-emitting layer between electrodes consisting of an anode and a cathode and characterized in that the light-emitting layer is formed with the composition according to the present invention. The polymer LED according to the present invention includes a polymer light-emitting device at least comprising a layer containing a conductive polymer adjacent to one of the electrodes between the electrode and the light-emitting layer; and a polymer light-emitting device at least comprising a insulation layer with an average film thickness of 2 nm or less adjacent to one of the electrodes between the electrode and the light-emitting layer.

Furthermore, examples of a polymer LED according to the present invention include a polymer LED formed by providing an electron transport layer between an cathode and a light-emitting layer;

a polymer LED formed by providing a hole transport layer between an anode and a light-emitting layer; and a polymer LED formed by providing an electron transport layer between an cathode and a light-emitting layer and a hole transport layer between the anode and the light-emitting layer.

Specific examples of a structure of a polymer LED according to the present invention include the following structures a) to d).

a) anode/light-emitting layer/cathode
b) anode/hole transport layer/light-emitting layer/cathode
c) anode/light-emitting layer/electron transport layer/cathode
d) anode/hole transport layer/light-emitting layer/electron transport layer/cathode (where the mark "/" means that individual layers are stacked in adjacent to each other.)

Herein, the light-emitting layer is a layer with a function to emit light; the hole transport layer is a layer with a function to transport holes; and an electron transport layer is a layer with a function to transport electrons. Note that the electron transport layer and the hole transport layer are collectively called as a charge transport layer. The light-emitting layer, the hole transport layer, and the electron transport layer may be independently used as two or more layers.

Of the charge transport layers provided in adjacent to an electrode, one having a function of improving charge injection efficiency from the electrode and an effect of reducing the driving voltage of the device is generally called particularly as a charge injection layer (hole injection layer, electron injection layer) in some cases.

To improve adhesion properties to an electrode and improve charge injection from the electrode, the charge injection layer or an insulating layer of 2 nm or less in thickness may be provided in adjacent to the electrode. Alternatively, to improve adhesion properties to the interface or to prevent contamination, a thin insulating layer may be inserted into the interface between a charge transport layer and a light-emitting layer. The order, number and thickness of layers to be stacked can be appropriately set in consideration of light emission efficiency and the lifespan of a device.

In the present invention, as a polymer LED having a charge injection layer (electron injection layer, hole injection layer) provided therein, mention may be made of a polymer LED having a charge injection layer in adjacent to a cathode and a polymer LED having an charge injection layer in adjacent to an anode. For example, the following structures e) to p) may be specifically mentioned.

e) anode/charge injection layer/light-emitting layer/cathode
f) anode/light-emitting layer/charge injection layer/cathode
g) anode/charge injection layer/light-emitting layer/charge injection layer/cathode
h) anode/charge injection layer/hole transport layer/light-emitting layer/cathode
i) anode/hole transport layer/light-emitting layer/charge injection layer/cathode
j) anode/charge injection layer/hole transport layer/light-emitting layer/charge injection layer/cathode
k) anode/charge injection layer/light-emitting layer/electron transport layer/cathode
l) anode/light-emitting layer/electron transport layer/charge injection layer/cathode
m) anode/charge injection layer/light-emitting layer/electron transport layer/charge injection layer/cathode
n) anode/charge injection layer/hole transport layer/light-emitting layer/electron transport layer/cathode
o) anode/hole transport layer/light-emitting layer/electron transport layer/charge injection layer/cathode
p) anode/charge injection layer/hole transport layer/light-emitting layer/electron transport layer/charge injection layer/cathode.

Specific examples of the charge injection layer include
a layer containing an electric conductive polymer;
a layer formed between an anode and a hole transport layer and containing ionization potential value between that of an anode material and a hole transportable material contained in the hole transport layer; and
a layer provided between a cathode and an electron transport layer and having an electron affinity value between that of an anode material and an electron transportable material contained in the electron transport layer.

When the charge injection layer is a layer containing an electric conductive polymer, the electric conductivity of the electric conductive polymer is preferably $10^{-5}$ S/cm to $10^3$ (both inclusive), more preferably $10^{-5}$ S/cm to $10^2$ (both inclusive), and further preferably $10^{-5}$ S/cm to $10^1$ (both inclusive) to reduce a leakage current between light-emitting pixels.

When the charge injection layer is a layer containing an electric conductive polymer, the electric conductivity of the electric conductive polymer is preferably $10^{-5}$ S/cm to $10^3$ S/cm (both inclusive), more preferably $10^{-5}$ S/cm to $10^2$ S/cm (both inclusive), and further preferably $10^{-5}$ S/cm to $10^1$ S/cm (both inclusive) to reduce a leakage current between light-emitting pixels. To set an electric conductivity of the electric conductive polymer at $10^{-5}$ S/cm to $10^3$ (both inclusive), generally an appropriate amount of ions are doped in the electric conductive polymer.

The type of ions, if they are doped into a hole injection layer, are anion and if they are doped into an electron injection layer, are cations. Examples of the anions include polystyrene sulfonic acid ion, alkylbenzene sulfonic acid ion and camphor sulfonic acid ion. Examples of the cations include lithium ion, sodium ion, potassium ion and tetrabutylammonium ion. The film thickness of a charge injection layer is from 1 nm to 100 nm, and preferably, 2 nm to 50 nm.

The material to be used in a charge injection layer may be appropriately selected in connection with the material to be used in a layer adjacent to an electrode. Examples thereof include polyaniline or a derivative thereof;
polythiophene or a derivative thereof;
polypyrrole or a derivative thereof;
polyphenylenevinylene or a derivative thereof;
polythienylenevinylene or a derivative thereof;
polyquinoline or a derivative thereof;
polyquinoxaline or a derivative thereof;
an electric conductive polymer such as a polymer containing an aromatic amine structure in the main chain or a side chain;
metal phthalocyanine (such as copper phthalocyanine); and
carbon.

The insulating layer having a film thickness of 2 nm or less has a function of facilitating charge injection. Examples of the material of the insulating layer include a metal fluoride, metal oxide and organic insulating material. Examples of a polymer LED having an insulating layer of a film thickness of 2 nm or less include a polymer LED having an insulating layer having a film thickness of 2 nm or less in adjacent to a cathode, and
a polymer LED having an insulating layer having a film thickness of 2 nm or less in adjacent to an anode.

For example, the following structures q) to ab) may be specifically mentioned.

q) anode/insulating layer having a film thickness of 2 nm or less/light-emitting layer/cathode r) anode/light-emitting layer/insulating layer having a film thickness of 2 nm or less/cathode s) anode/insulating layer having a film thickness of 2 nm or less/light-emitting layer/insulating layer having a film thickness of 2 nm or less/cathode t) anode/insulating layer having a film thickness of 2 nm or less/hole transport layer/light-emitting layer/cathode u) anode/hole transport layer/light-emitting layer/insulating layer having a film thickness of 2 nm or less/cathode v) anode/insulating layer having a film thickness of 2 nm or less/hole transport layer/light-emitting layer/insulating layer having a film thickness of 2 nm or less/cathode w) anode/insulating layer having a film thickness of 2 nm or less/light-emitting layer/electron transport layer/cathode x) anode/light-emitting layer/electron transport layer/insulating layer having a film thickness of 2 nm or less/cathode y) anode/insulating layer having a film thickness of 2 nm or less/light-emitting layer/electron transport layer/insulating layer having a film thickness of 2 nm or less/cathode z) anode/insulating layer having a film thickness of 2 nm or less/hole transport layer/light-emitting layer/electron transport layer/cathode aa) anode/hole transport layer/light-emitting layer/electron transport layer/insulating layer having a film thickness of 2 nm or less/cathode ab) anode/insulating layer having a film thickness of 2 nm or less/hole transport layer/light-emitting layer/electron transport layer/insulating layer having a film thickness of 2 nm or less/cathode The optimal value of film thickness of the light-emitting layer differs depending upon a material to be used. The film thickness may be selected such that driving voltage and light emission efficiency take appropriately values. The film thickness is, for example, 1 nm to 1 µm, preferably 2 nm to 500 nm, and further preferably, 5 nm to 200 nm.

The light-emitting layer can also be formed with a composition according to the present invention.

When a polymer LED according to the present invention has a hole transport layer, examples of the hole transportable material to be employed include polyvinylcarbazole or a derivative thereof; polysilane or a derivative thereof; polysiloxane derivative having an aromatic amine in a side chain or the main chain; pyrazoline derivative; arylamine derivative; stilbene derivative; triphenyl-diamine derivative; polyaniline or a derivative thereof; polythiophene or a derivative thereof; polypyrrole or a derivative thereof; poly(p-phenylenevinylene) or a derivative thereof; and poly(2,5-thienylenevinylene) or a derivative thereof.

Specific examples of the hole transportable material include those described in JP-A-63-70257, JP-A-63-175860, JP-A-2-135359, JP-A-2-135361, JP-A-2-209988, JP-A-3-37992, and JP-A-3-152184.

Of them, as a hole transportable material for use in hole transport layer, mention may be preferably made of polymer hole transportable materials such as polyvinylcarbazole or a derivative thereof, polysilane or a derivative thereof, a polysiloxane derivative having an aromatic amine compound group in a side chain or the main chain, polyaniline or a derivative thereof, polythiophene or a derivative thereof, poly(p-phenylenevinylene) or a derivative thereof, and poly(2,5-thienylenevinylene) or a derivative thereof; and more preferably, polyvinylcarbazole or a derivative thereof, polysilane or a derivative thereof, a polysiloxane derivative having an aromatic amine in a side chain or the main chain. The hole transportable material of a low molecular compound is preferably used by dispersing it in a polymer binder.

Poly(N-vinylcarbazole) or a derivative thereof can be obtained from a vinyl monomer through cation polymerization or radical polymerization.

Examples of polysilane or a derivative thereof include compounds described in Chem. Rev. Vol. No. 89, p. 1359 (1989) and the published specification of British Patent GB2300196. As a synthetic method thereof, the method described in these documents can be used. In particular, the Kipping method can be suitably used.

In polysiloxane or a derivative thereof, since a polysiloxane skeleton structure has no hole transportability, one having the aforementioned structure of a low molecular weight hole transportable material in a side chain or the main chain is suitably used. In particular, one having a hole transportable aromatic amine in a side chain or the main chain may be mentioned.

A method of forming a hole transfer layer film is not particularly limited. In the case of low molecular weight hole transportable material, a method of forming a film from a mixed solution with a polymer binder may be mentioned. In the case of a high molecular weight hole transportable material, a method of forming a film from a solution may be mentioned.

A solvent for use in film-formation from a solution is not particularly restricted as long as the solvent dissolves a hole transportable material. Examples of the solvent may include the solvents used for the solution composition according to the present invention.

Examples of the film formation method from a solution include a spin-coating method, casting method, microgravure coating method, gravure-coating method, bar-coating method, roll-coating method, wire-bar coating method, dip-coating method, spray-coating method, screen printing method, flexographic printing method, offset printing method and inkjet method.

As the polymer binder to be mixed, it is preferred to use one which does not inhibit charge transfer extremely. Furthermore, it is suitable to use one having no intensive absorption to visible light. Example of the polymer binder include polycarbonate, polyacrylate, polymethylacrylate, polymethylmethacrylate, polystyrene, polyvinylchloride and polysiloxane.

As the film thickness of a hole transport layer, its optimal value varies depending upon the material to be used. The film thickness may be selected such that driving voltage and light emission efficiency take appropriately values. However, it is at least required to have a sufficient film thickness not to produce pin holes. The extremely thick film is not preferable because the driving voltage of the device increases. Accordingly, the film thickness of the hole transport layer is, for example, from 1 nm to 1 µm, preferably 2 nm to 500 nm, and further preferably, 5 nm to 200 nm.

The hole transport layer can also be formed with a composition according to the present invention.

When a polymer LED according to the present invention has an electron transport layer, as the electron transportable material to be used, a known material may be used. Examples thereof include a metal complex of oxadiazole derivative thereof;
anthraquinodimethane derivative thereof,
benzoquinone or a derivative thereof,
naphthoquinone or a derivative thereof,
anthraquinone or a derivative thereof,
tetracyanoanthraquino-dimethane or a derivative thereof, fluorenone derivative,
diphenyl-dicyanoethylene or a derivative thereof;
diphenoquinone derivative, or
8-hydroxyquinoline or a derivative thereof;
polyquinoline or a derivative thereof;
polyquinoxaline or a derivative thereof; and
polyfluorene or a derivative thereof.

Specific examples include those described in JP-A-63-70257, JP-A-63-175860, JP-A-2-135359, JP-A-2-135361, JP-A-2-209988, JP-A-3-37992 and JP-A-3-152184.

Of them, mention is preferably made of a metal complex of oxadiazole derivative thereof,
benzoquinone or a derivative thereof,
anthraquinone or a derivative thereof, or
8-hydroxyquinoline or a derivative thereof;
polyquinoline or a derivative thereof;
polyquinoxaline or a derivative thereof; and
polyfluorene or a derivative thereof, and further preferably, 2-(4-viphenyl)-5-(4-t-butylphenyl)-1,3,4-oxadiazole, benzoquinone, anthraquinone, tris(8-quinolyl)aluminum and polyquinoline.

A film formation method for an electron transport layer is not particularly limited. Examples of a film formation method using a low molecular weight electron transportable material include a vacuum deposition method for forming a film from powder and a method for forming a film from a solution or molten state. Examples of a film formation method using a high molecular weight electron transportable material include a method of forming a film from a solution or molten state. In the method of forming a film from a solution or molten state, a polymer binder may be used together.

A solvent for use in film-formation from a solution is not particularly restricted as long as the solvent dissolves an electron transportable material and/or a polymer binder. Examples of the solvent include
chlorine base solvents such as chloroform, methylene chloride, and dichloroethane;
ether base solvents such as tetrahydrofuran;
aromatic hydrocarbon base solvents such as toluene and xylene;
ketone base solvents such as acetone and methylethyl ketone; and
ester solvents such as ethyl acetate, butyl acetate and ethyl-cellosolve acetate.

As a method of forming a film from a solution or a molten state, use may be made of coating methods such as a spin-coating method, casting method, microgravure coating method, gravure-coating method, bar-coating method, roll-coating method, wire-bar coating method, dip-coating method, spray-coating method, screen printing method, flexographic printing method, offset printing method and ink-jet method.

As the polymer binder to be mixed, it is preferred to use one which does not inhibit charge transfer extremely. Furthermore, it is suitable to use one having no intensive absorption to visible light. Example of the polymer binder include poly (N-vinylcarbazole), polyaniline or a derivative thereof, polythiophene or a derivative thereof, poly(p-phenylenevinylene) or a derivative thereof, poly(2,5-thienylenevinylene) or a derivative thereof, polycarbonate, polyacrylate, polymethylacrylate, polymethylmethacrylate, polystyrene, polyvinylchloride and polysiloxane.

As the film thickness of an electron transport layer, its optimal value varies depending upon the material to be used. The film thickness may be selected such that driving voltage and light emission efficiency take appropriately values. However, it is at least required to have a sufficient film thickness not to produce pin holes. The extremely thick film is not preferable because the driving voltage of the device increases. Accordingly, the film thickness of the electron transport layer is, for example, from 1 nm to 1 μm, preferably 2 nm to 500 nm, and further preferably, 5 nm to 200 nm.

The electron transport layer can also be formed with a composition according to the present invention.

As a substrate on which a polymer LED according to the present invention is formed, any substrate may be used as long as it cannot be influenced when an electrode is formed and then an organic material layer is formed. Examples of the substrate include substrates formed of glass, plastic, polymer film and silicon. When an opaque substrate is used, the opposite electrode is preferably transparent or semitransparent.

Generally, at least one of the electrodes consisting of an anode and a cathode is transparent or semitransparent. The anode is preferably transparent or semitransparent. As the material for the anode, use may be made of, for example, a conductive metal oxide film and semitransparent metal thin film. Specific examples thereof include a film (NESA) formed of electrically conductive glass made of, for example, indium oxide, zinc oxide, tin oxide; and composites these such as indium tin oxide (ITO), indium/zinc/oxide, gold, platinum, silver and copper; and ITO, indium/zinc/oxide and tin oxide are preferable. Examples of the forming method include a vacuum deposition method, sputtering method, ion plating method and plating method. Furthermore, as the anode, use may be made of an organic electric conductive film such as polyaniline or a derivative thereof or polythiophene or a derivative thereof. The film thickness of an anode may be appropriately set in consideration of light permeability and electric conductivity, and is for example, 10 nm to 10 μm, preferably, 20 nm to 1 μm, and further preferably, 50 nm to 500 nm. To facilitate injection of charge, a layer having an average thickness of 2 nm and formed of a phthalocyanine derivative, electric conductive polymer or carbon or formed of a metal oxide, metal fluoride or an organic insulating material, may be provided on the anode.

As a material for the cathode to be used in a polymer LED according to the present invention, one having a small work function is preferable. Examples of the material to be used include
metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium;
alloys formed of at least two of them;
alloys formed of at least one of them and one selected from the group consisting of gold, silver, platinum, copper, manganese, titanium, cobalt, nickel, tungsten and tin;
graphite; and a graphite intercalation compound.

Examples of the alloy include
Magnesium-silver alloy, magnesium-indium alloy, magnesium-aluminum alloy, indium-silver alloy, lithium-aluminum alloy, lithium-magnesium alloy, lithium-indium alloy and calcium-aluminum alloy. The cathode may have a stacked structure consisting of two or more layers. The film thickness of a cathode may be appropriately set in consideration of electric conductivity and durability, and is for example, 10 nm to 10 μm, preferably 20 nm to 1 μm and further preferable 50 nm to 500 nm.

Examples of the method of forming a cathode include a vacuum deposition method, sputtering method, laminate method in which a metal thin film is formed by thermocompression bonding. Furthermore, a layer formed of an electric conductive polymer or a layer formed of e.g., a metal oxide, metal fluoride, or organic insulating material and having an average film thickness of 2 nm or less may be provided between the cathode and an organic layer. Alternatively, after the cathode is formed, a protecting layer for protecting the polymer LED may be applied. To use the polymer LED stably for a long time, the device may be externally protected preferably with a protecting layer and/or a protecting cover.

As the protecting layer, use may be made of e.g., a polymer compound, metal oxide, metal fluoride and metal borate. Furthermore, as the protecting cover, use may be made of e.g., glass plate and plastic plate on the surface of which treatment of lowing water permeability is applied. A method of adhering the cover tight with the substrate of a device with a thermoplastic resin or a photosetting resin, thereby sealing them, is preferably used. It is easy to prevent the device from being damaged by keeping a space by use of a spacer. If an inert gas such as nitrogen or argon is introduced into the space, it is possible to prevent oxidation of the cathode. Furthermore, if a desiccating agent such as barium oxide is placed in the space, it is possible to suppress a moisture content adsorbed in the manufacturing step from damaging the device. At least one of the methods is preferably employed.

A polymer light-emitting device according to the present invention may be used as a planar light source or a backlight of a segment type display device, a dot matrix display device, a liquid crystal display device, and the like.

To obtain planar light emission by use of a polymer LED according to the present invention, a planar anode and a planar cathode are placed so as to overlap with each other. To obtain patterned light emission, there are a method in which a mask having a patterned window is provided on the surface of the planar light-emitting device;

a method in which an organic material layer used in non light-emitting portion is formed extremely thick substantially not to emit light from the portion; and a method in which either one of or both of the anode and cathode are formed so as to have a pattern. A pattern is formed in accordance with any one of the methods, and several electrodes are arranged so as to independently turn ON/Off. In this way, it is possible to obtain a segment type display device capable of displaying numerical values, characters, and simple symbols. Furthermore, to obtain a dot-matrix device, both an anode and a cathode may be formed in stripe form and arranged so as to cross perpendicularly with each other. Sector color display and multicolor display can be attained by a method of separately applying a plurality of types of polymer phosphors different in emission color, or by a method of using a color filter or a fluorescent conversion filter. A dot matrix device can be driven passively and may be driven actively in combination with, for example, TFT. These display devices can be used as display devices of a computer, television, portable handheld unit, mobile phone, car navigation and a view finder of a video camera, etc.

Furthermore, the planar light-emitting device is a thin-film spontaneous light-emitting device and suitably used as a planar light source for a backlight of a liquid crystal display device or a planar illumination light source. Furthermore, if a flexible substrate is used, the planar light emitting device can be used also as a curved surface light source or display device.

Furthermore, the solution composition of the present invention may be used for preparing a laser dye layer, a material for an organic solar battery, an organic semiconductor for an organic transistor and a material for a conductive thin film.

EXAMPLES

Now, the present invention will be more specifically explained with reference to Examples below, which will not be construed as limiting the invention.

Herein, as to number average molecular weight and weight average molecular weight, gel permeation chromatography (GPC) (tradename: LC-10Avp manufactured by SHIMADZU CORPORATION) was used to determine Z average molecular weight, number average molecular weight, and weight average molecular weight relative to polystyrene. A polymer to be measured was dissolved in tetrahydrofuran so that its concentration became about 0.5 wt %, and 50 µL of this solution was injected into the GPC. Tetrahydrofuran was used for mobile phase of the GPC and flowed at a rate of 0.6 mL/min. As for a column, two TSKgel SuperHM-H (tradename, manufactured by Tosoh Corporation) and one TSKgel SuperH2000 (tradename, manufactured by Tosoh Corporation) were combined serially. As for a detector, a differential refractometer detector (tradename: RID-10A manufactured by SHIMADZU CORPORATION) was used.

The profile of a thin film was measured by charging 3 mL of a composition into a syringe, dispensing the composition on a glass substrate with the syringe to which a high precision needle FN-002N (tradename, 20 µm pore size, manufactured by Musashi Engineering, Inc.) is attached, drying the composition under a reduced pressure in vacuo at an ordinary temperature for 10 minutes, and then measuring the profile of the dried thin film with an interference microscope Micromap557N (tradename, manufactured by Micromap Corporation). In measuring viscosity, LVDV-II+Pro (tradename) manufactured by BROOKFIELD Engineering Laboratories was used.

Synthesis Example 1

Synthesis of Polymer 1

Under a nitrogen atmosphere, 195.37 g of the following compound A, 239.44 g of the following compound B, and 232.89 g of 2,2'-bipyridyl were dissolved in 46.26 kg of dehydrated tetrahydrofuran. After that, this solution was heated up to 60° C., 410.15 g of bis(1,5-cyclooctadiene) nickel(0) {Ni(COD)$_2$} was added thereto, thereby effecting a reaction for 5 hours. After the reaction was complete, this reaction solution was cooled to room temperature, added dropwise to a mixed solution of 8.52 kg of 25% aqueous ammonia/16.88 kg of methanol/31.98 kg of ion exchanged water, and stirred for 2 hours. After that, precipitated substance was filtrated and dried under a reduced pressure. After the drying, the substance was dissolved in 16.22 kg of toluene. After the dissolution, 830 g of Radiolight was added thereto and insoluble matters were filtrated. Thus obtained filtrate was purified through an alumina column. Subsequently, the purified solution was added to a mixture of 13.52 kg of ion exchanged water/2.04 kg of 25% aqueous ammonia, stirred for 0.5 hours and the water layer was removed. Furthermore, 13.52 kg of ion exchanged water was added to the organic layer, stirred for 0.5 hours and the water layer was removed. A part of the resulting organic layer was concentrated under a reduced pressure and added to 34.18 kg of methanol and stirred for an hour. The resulting precipitated substance was filtrated and dried under a reduced pressure. The yield of the resulting polymer (hereafter, referred to as Polymer 1) was 234.54 g.

The number average molecular weight of Polymer 1 relative to polystyrene was Mn=$1.2 \times 10^4$. The weight average molecular weight of Polymer 1 relative to polystyrene was Mw=$7.7 \times 10^4$.

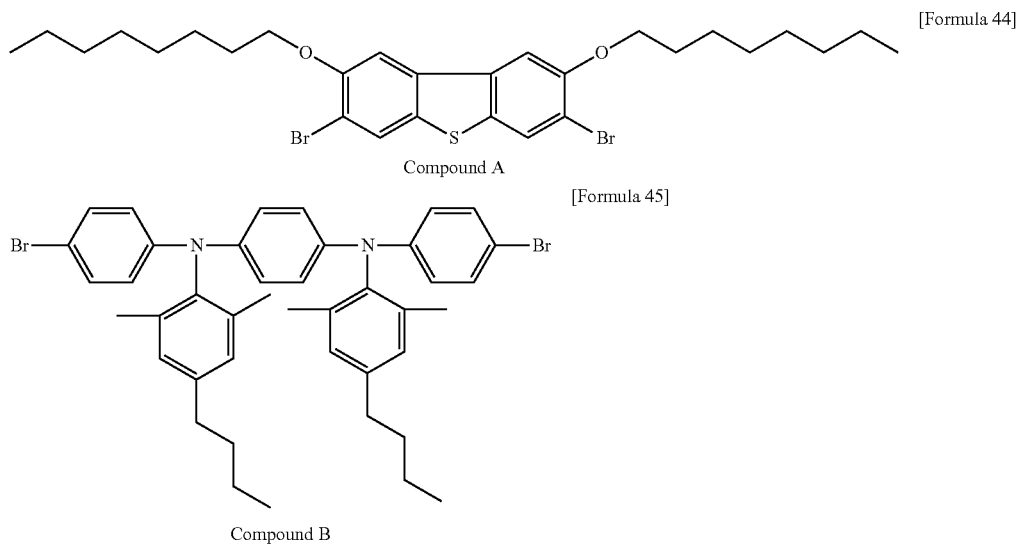

Compound A

Compound B

Example 1

Production of Composition 1

0.10 g of Polymer 1 was dissolved in a mixed solution of 3.0 g of phenetole and 7.0 g of acetophenone (boiling point: 202° C.) to produce Composition 1.

Production Example 1

Production of Composition 2

0.10 g of Polymer 1 was dissolved in a mixed solution of 3.0 g of anisole and 7.0 g of xylene (boiling point: 137 to 140° C.) to produce Composition 2.

Measurement Example 1

Viscosity Measurement of Composition 2

The viscosity of Composition 2 was measured to be 1.1 mPa·s.

Example 2

Forming of Thin Film

A thin film was formed by the above-mentioned method with Composition 1. The profile of the thin film was close to a plane as shown in FIG. 1. The value obtained by dividing the film thickness of the thickest portion by the film thickness of the central portion of the film was 1.15.

Comparative Example 1

Forming of Thin Film

Figure 2:
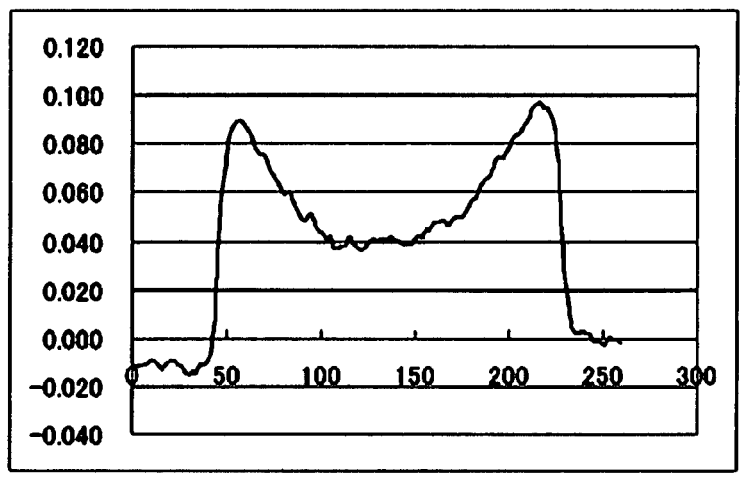
FIG. 2 shows a profile of a thin film formed with a composition 2 where the axis of abscissa indicates a distance (μm) of the film, and the axis of ordinate indicates a film thickness (μm) of the film.

A thin film was formed by the above-mentioned method with Composition 2. The profile of the thin film was concave as shown in FIG. 2. The value obtained by dividing the film thickness of the thickest portion by the film thickness of the central portion of the film was 2.38.

Example 3

Production of Composition 3

0.10 g of Polymer 1 was dissolved in a mixed solution of 3.0 g of phenetole and 7.0 g of bicyclohexyl (boiling point: 226 to 228° C.) to produce Composition 3.

Example 4

Viscosity Measurement of Composition 3

The viscosity of Composition 3 was measured to be 3.0 mPa·s.

Example 5

Evaluation of Fluorescence Characteristics of Composition 3

Composition 3 was spin-coated on a quarts plate to form a polymer thin film. The fluorescence spectrum of the thin film was measured with a fluorescence spectrophotometer (tradename: Fluorolog manufactured by JOBINYVON-SPEX) with an excitation wavelength of 350 nm.

The fluorescence peak wavelength of Composition 3 was 457 nm.

Example 6

Production of Composition 4

0.10 g of Polymer 1 was dissolved in a mixed solution of 3.0 g of phenetole and 7.0 g of n-dodecane (boiling point: 216° C.) to produce Composition 4.

Example 7

Production of Composition 5

0.10 g of Polymer 1 was dissolved in a mixed solution of 5.0 g of phenoxyphenol and 5.0 g of tetralin (boiling point: 207° C.) to produce Composition 5.

Example 8

Viscosity Measurement of Composition 5

The viscosity of Composition 5 was measured to be 4.1 mPa·s.

Example 9

Production of Composition 6

0.10 g of Polymer 1 was dissolved in a mixed solution of 7.0 g of tetralin (boiling point: 207° C.) and 3.0 g of bicyclohexyl (boiling point: 226 to 228° C.) to produce Composition 6.

Example 10

Forming of Thin Film

Figure 3:
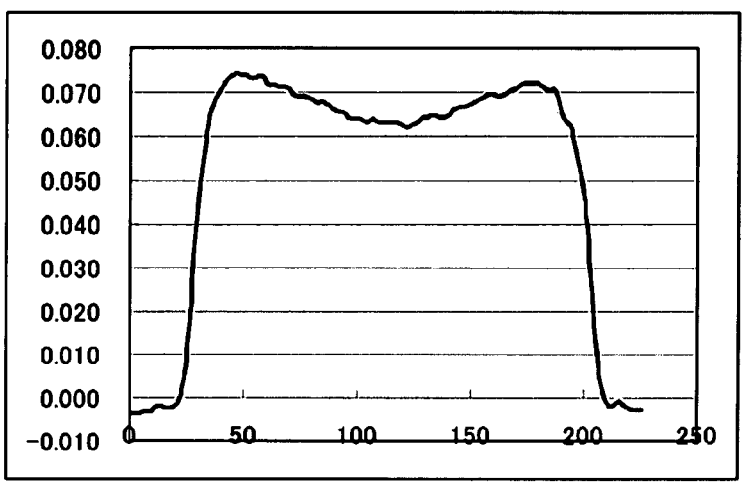
FIG. 3 shows a profile of a thin film formed with a composition 6 where the axis of abscissa indicates a distance (μm) of the film, and the axis of ordinate indicates a film thickness (μm) of the film.

A thin film was formed by the above-mentioned method with Composition 6. The profile of the thin film was close to a plane as shown in FIG. 3. The value obtained by dividing the film thickness of the thickest portion by the film thickness of the central portion of the film was 1.14.

Example 11

Viscosity Measurement of Composition 6

The viscosity of Composition 6 was measured to be 4.0 mPa·s.

Example 12

Production of Composition 7

0.10 g of Polymer 1 was dissolved in a mixed solution of 3.0 g of tetralin (boiling point: 207° C.) and 7.0 g of 2-(1-cyclohexenyl)cyclohexanone (boiling point: 265° C.) to produce Composition 7.

Example 13

Viscosity Measurement of Composition 7

The viscosity of Composition 7 was measured to be 8.8 mPa·s.

Example 14

Production of Composition 8

0.10 g of Polymer 1 was dissolved in a mixed solution of 3.0 g of methyl benzoate (boiling point: 199° C.) and 7.0 g of bicyclohexyl (boiling point: 226 to 228° C.) to produce Composition 8.

Example 15

Viscosity Measurement of Composition 8

The viscosity of Composition 8 was measured to be 3.6 mPa·s.

Example 16

Evaluation of Fluorescence Characteristics of Composition 8

Composition 8 was spin-coated on a quarts plate to form a polymer thin film. The fluorescence spectrum of the thin film was measured with a fluorescence spectrophotometer (tradename: Fluorolog manufactured by JOBINYVON-SPEX) with an excitation wavelength of 350 nm.

The fluorescence peak wavelength of Composition 8 was 464 nm.

The invention claimed is:

1. A composition comprising:
one or more aromatic ether compounds selected from the group consisting of anisole, ethyl phenyl ether, propyl phenyl ether, butyl phenyl ether, methylanisole, dimethylanisole, ethylanisole, methylethylanisole, diethylanisole, propylanisole, butylanisole, pentylanisole, hexylanisole, heptylanisole, octylanisole, methyl naphthyl ether, and diphenyl ether;
one or more compounds having boiling points equal to or higher than 200° C. selected from the group consisting of acetophenone, n-dodecane, n-tridecane, n-tetradecane, 1-nonanol, n-decanol, 2-decanol, n-undecanol, isodecanol, n-tetradecanol, diethylene glycol, triethylene glycol, triethylene glycol dimethyl ether, tetraethylene glycol dimethyl ether, ethylene glycol mono-2-ethylhexyl ether, ethylene glycol monobutyl ether, ethylene glycol monohexyl ether, ethylene glycol monobenzyl ether, dipropylene glycol, tripropylene glycol, 1,3-butanediol, 1,4-butanediol, neopentyl glycol, 1,5-pentanediol, 1,6-hexanediol, n-octyl acetate, diethyl succinate, acetamide, thiodiglycol, bicyclohexyl, 2-(1-cyclohexenyl)cyclohexanone, γ-butyrolactone, propylene carbonate, δ-valerolactone, isophorone, N-methylpyrrolidone, 2-pyrrolidone, sulfolane, n-pentylbenzene, n-hexylbenzene, n-heptylbenzene, n-octylbenzene, n-nonalbenzene, n-decylbenzene, 1,3-di-isopropylbenzene, 1,4-di-isopropylbenzene, cyclohexylbenzene, tetralin, biphenyl, m-cresol, p-cresol, p-ethylphenol, 4-methoxyphenol, o-n-propylphenol, o-isopropylphenol, o-s-butylphenol, o-t-butylphenol, m-t-butylphenol, p-t-butylphenol, benzyl alcohol, ethyl benzoate, n-butyl benzoate, benzoic acid, phenylacetic acid, quinoline and imidazole;
and one or more polymers that transport charges or emit light in a solid state, and comprise any one of the repeat units represented by the following formulae (1) to (8):

$$\mathrm{-Ar_1-N\!\!\!\!\underset{Ar_4}{\overset{}{\mid}}\!\!\!\!-(\!Ar_2\!-\!\!\!\!\underset{Ar_5}{\overset{}{\mid}}\!\!\!\!N\!\!)_{\!x}\!-\!Ar_3} \quad (1)$$
$$\phantom{-Ar_1-}\underset{\underset{Ar_7}{\overset{}{\mid}}}{\overset{}{\underset{\mid}{N}}}\!\!-\!Ar_6$$
$$\phantom{-Ar_1-}\!\!)_y$$

wherein $Ar_1$, $Ar_2$, $Ar_3$ and $Ar_4$ each independently represent an arylene group or a divalent heterocyclic group; $Ar_5$, $Ar_6$ and $Ar_7$ each independently represent an aryl group or a monovalent heterocyclic group; $Ar_1$, $Ar_2$, $Ar_3$, $Ar_4$, $Ar_5$, $Ar_6$, and $Ar_7$ may have a substituent; and x and y each independently represent 0 or a positive integer;

(2)

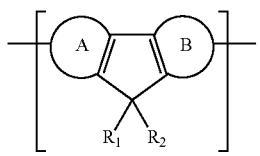

wherein ring A and ring B each independently represent an aromatic hydrocarbon ring that may have a substituent; two bonds are respectively present on the ring A and/or the ring B; and $R_1$ and $R_2$ each independently represent a substituent;

(3)

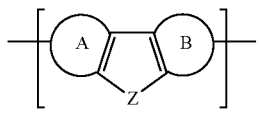

wherein ring A and ring B are defined as above; two bonds are respectively present on the ring A and/or the ring B; Z represents —O—, —S—, —S(=O)—, —S(=O)(=O)—, —N($R_3$)—, —Si($R_3$)($R_4$)—, —P(=O)($R_3$)—, —P($R_3$)—, —B($R_3$)—, —C($R_3$)($R_4$)—O—, —C($R_3$)=N— or —Se—; and $R_3$ and $R_4$ each independently represent a substituent;

(4)

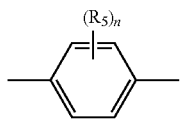

wherein $R_5$ represents a substituent; n represents an integer of 0 to 4; and when a plurality of $R_5$ are present, they may be the same or different;

(5)

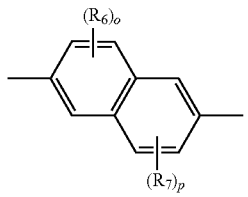

wherein $R_6$ and $R_7$ represent a substituent; o and p each independently represent an integer of 0 to 3; and when a plurality of $R_6$ and $R_7$ are present, they may be the same or different;

(6)

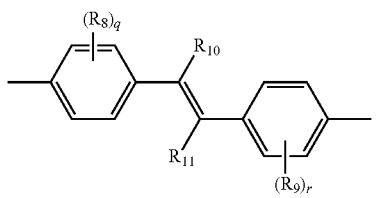

wherein $R_8$, $R_9$, $R_{10}$, and $R_{11}$ represent a substituent; q and r each independently represent an integer of 0 to 4; and when a plurality of $R_8$ and $R_9$ are present, they may be the same or different;

(7)

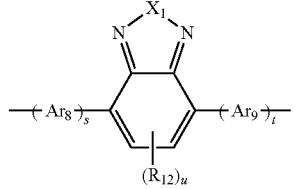

wherein $R_{12}$ represents a substituent; u represents an integer of 0 to 2; $Ar_8$ and $Ar_9$ each independently represent an arylene group, divalent heterocyclic group, or divalent group including a metal complex structure; s and t each independently represent 0 or 1; $X_1$ represents —O—, —S—, —S(=O)—, —SO$_2$—, —Se—, or —Te—; and when a plurality of $R_{12}$ are present, they may be the same or different;

(8)

$$-\!\!-\!\!(Ar_{10})_v\!\!-\!\!\underset{X_3-X_4}{\overset{X_2}{\diagdown\!\!\diagup}}\!\!-\!\!(Ar_{11})_w\!\!-\!\!-$$

wherein $Ar_{10}$ and $Ar_{11}$ each independently represent an arylene group, divalent heterocyclic group, or divalent group including a metal complex structure; v and w each independently represent 0 or 1; $X_2$ represents —O—, —S—, —S(=O)—, —S(=O)(=O)—, —Se—, —Te—, —NR$_{14}$—, or —SiR$_{15}$R$_{16}$—; $R_{14}$, $R_{15}$ and $R_{16}$ each independently represent a hydrogen atom, an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imido group, monovalent heterocyclic group, carboxyl group, substituted carboxyl group, nitro group, or cyano group; and $X_3$ and $X_4$ represent a nitrogen atom.

2. The composition according to claim 1, comprising 10 to 60 wt % of the aromatic ether compounds based on a total weight of the composition.

3. The composition according to claim 1, wherein the polymers have weight average molecular weights of $1.0 \times 10^3$ to $1.0 \times 10^7$ relative to polystyrene.

4. The composition according to claim 1, comprising 0.1 to 5.0 wt % of the polymers based on a total weight of the composition.

5. The composition according to claim 1, having a viscosity of 1 to 20 mPa·s.

6. A thin film characterized by being formed with the composition according to claim 1.

7. The thin film according to claim 6, wherein a value obtained by dividing a film thickness of a thickest portion by a film thickness of a central portion of the film is equal to or less than 1.50.

8. A polymer light-emitting device comprising at least a light-emitting layer between electrodes consisting of an anode and a cathode, characterized in that the light-emitting layer is formed with the composition according to claim 1 comprising one or more polymers that emit light in a solid state.

9. A polymer light-emitting device comprising at least a light-emitting layer and a hole transport layer between electrodes consisting of an anode and a cathode, characterized in that the hole transport layer is formed with the composition according to claim 1 comprising one or more polymers that transport charges.

10. A polymer light-emitting device comprising at least a light-emitting layer and an electron transport layer between electrodes consisting of an anode and a cathode, characterized in that the electron transport layer is formed with the composition according to claim 1 comprising one or more polymers that transport charges.

11. A method for forming the polymer light-emitting device according to claim 8, characterized by using a print method.

12. A method for forming the polymer light-emitting device according to claim 8, characterized by using an inkjet method.

13. A planar light source characterized by comprising a polymer light-emitting device according to claim 8.

14. A segment display device characterized by comprising a polymer light-emitting device according to claim 8.

15. A dot matrix display device characterized by comprising the polymer light-emitting device according to claim 8.

16. A liquid crystal display device characterized by comprising the polymer light-emitting device according to claim 8 as a backlight.

\* \* \* \* \*